United States Patent
Marukame et al.

(10) Patent No.: US 12,182,693 B2
(45) Date of Patent: Dec. 31, 2024

(54) MEMORY DEVICE AND NEURAL NETWORK APPARATUS

(71) Applicant: KABUSHIKI KAISHA TOSHIBA, Tokyo (JP)

(72) Inventors: Takao Marukame, Chuo Tokyo (JP); Koichi Mizushima, Kamakura Kanagawa (JP); Yoshifumi Nishi, Yokohama Kanagawa (JP); Kumiko Nomura, Shinagawa Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 794 days.

(21) Appl. No.: 17/461,440

(22) Filed: Aug. 30, 2021

(65) Prior Publication Data
US 2022/0300792 A1   Sep. 22, 2022

(30) Foreign Application Priority Data
Mar. 16, 2021   (JP) .................................. 2021-042835

(51) Int. Cl.
*G06N 3/063*   (2023.01)
*G06N 3/049*   (2023.01)
(Continued)

(52) U.S. Cl.
CPC .............. *G06N 3/063* (2013.01); *G06N 3/049* (2013.01); *G06N 3/08* (2013.01); *G11C 11/54* (2013.01); *G11C 13/0002* (2013.01)

(58) Field of Classification Search
CPC .......... G06N 3/063; G06N 3/049; G06N 3/08; G11C 11/54; G11C 13/0002
See application file for complete search history.

(56) References Cited

U.S. PATENT DOCUMENTS

| 10,175,947 B1 | 1/2019 | Marukame et al. |
| 10,340,002 B1 | 7/2019 | Kim et al. |

(Continued)

FOREIGN PATENT DOCUMENTS

| JP | 2018-120433 A | 8/2018 |
| JP | 2019-53563 A | 4/2019 |

(Continued)

OTHER PUBLICATIONS

Hong, Sungjin, et al. "Low voltage time-based matrix multiplier-and-accumulator for neural computing system." Electronics 9.12 (2020): 2138. (Year: 2020).*

(Continued)

*Primary Examiner* — Eric Nilsson
(74) *Attorney, Agent, or Firm* — Finnegan, Henderson, Farabow, Garrett & Dunner, LLP

(57) ABSTRACT

A memory device according to an embodiment can be used for storing weights for a neural network. An update circuit changes a difference between charge amounts accumulated in first/second accumulation circuits in the memory device. An output circuit outputs, as a weight, a signal corresponding to the difference between the charge amounts. The update circuit performs the change of the difference by changing, when the update amount is positive, the electric charges accumulated in the first accumulation circuit in a first direction by a charge amount corresponding to an absolute value of the update amount, the first direction being either an increasing direction or a decreasing direction, and changing, when the update amount is negative, the electric charges accumulated in the second accumulation circuit in the first direction by a charge amount corresponding to an absolute value of the update amount.

16 Claims, 18 Drawing Sheets

(51) Int. Cl.
*G06N 3/08* (2023.01)
*G11C 11/54* (2006.01)
*G11C 13/00* (2006.01)

(56) References Cited

U.S. PATENT DOCUMENTS

| | | | |
|---|---|---|---|
| 2018/0211154 A1 | 7/2018 | Mori et al. | |
| 2019/0156181 A1* | 5/2019 | Marukame | G06F 7/5443 |
| 2019/0318239 A1 | 10/2019 | Kim et al. | |
| 2020/0026496 A1 | 1/2020 | Marukame et al. | |
| 2020/0034695 A1 | 1/2020 | Marukame et al. | |
| 2020/0293861 A1 | 9/2020 | Marukame et al. | |
| 2020/0302274 A1 | 9/2020 | Marukame et al. | |
| 2020/0302275 A1 | 9/2020 | Nomura et al. | |
| 2020/0379733 A1 | 12/2020 | Berdan et al. | |
| 2020/0380347 A1 | 12/2020 | Marukame et al. | |
| 2021/0056383 A1 | 2/2021 | Nishi et al. | |
| 2021/0081771 A1 | 3/2021 | Marukame et al. | |
| 2021/0202274 A1 | 7/2021 | Yang et al. | |
| 2021/0216282 A1 | 7/2021 | Marukame et al. | |
| 2021/0279559 A1 | 9/2021 | Nishi et al. | |
| 2021/0318853 A1* | 10/2021 | Morie | G06N 3/063 |
| 2022/0068326 A1 | 3/2022 | Marukame et al. | |
| 2022/0083845 A1 | 3/2022 | Marukame et al. | |
| 2022/0138547 A1 | 5/2022 | Saito et al. | |
| 2022/0237452 A1 | 7/2022 | Marukame et al. | |

FOREIGN PATENT DOCUMENTS

| | | |
|---|---|---|
| JP | 2019-95860 A | 6/2019 |
| JP | 2020-13398 A | 1/2020 |
| JP | 2020-17114 A | 1/2020 |
| JP | 2020-197761 A | 12/2020 |
| JP | 2020-197922 A | 12/2020 |
| JP | 2021-33415 A | 3/2021 |
| JP | 2021-47530 A | 3/2021 |
| JP | 2021-111142 A | 8/2021 |
| JP | 2021-140320 A | 9/2021 |
| JP | 2022-37319 A | 3/2022 |
| JP | 2022-49425 A | 3/2022 |
| JP | 2022-72401 A | 5/2022 |
| JP | 2022-114793 A | 8/2022 |
| JP | 2022-129104 A | 9/2022 |

OTHER PUBLICATIONS

Seyoung Kim et al., "Analog CMOS-based Resistive Processing Unit for Deep Neural Network Training," 2017 IEEE 60$^{th}$ International Midwest Symposium on Circuits and Systems (MWSCAS), pp. 422-425 (2017).

Stefano Ambrogio et al., "Equivalent-accuracy accelerated neural-network training using analogue memory," Nature, vol. 558, pp. 60-67 (Jun. 2018).

* cited by examiner

MEMORY DEVICE AND NEURAL NETWORK APPARATUS

CROSS-REFERENCE TO RELATED APPLICATIONS

This application is based upon and claims the benefit of priority from Japanese Patent Application No. 2021-042835, filed on Mar. 16, 2021; the entire contents of which are incorporated herein by reference.

FIELD

Embodiments described herein relate generally to a memory device and a neural network apparatus.

BACKGROUND

In recent years, a neural network apparatus implemented by hardware has been studied. Each of units included in such a neural network apparatus implemented by hardware executes product-sum operation (multiply-accumulation) implemented by an electric circuit. Specifically, each unit implemented by an electric circuit multiplies, by a weight, each of input signals received from a unit in the previous stage, and adds the input signals to which the weights have been multiplied.

By the way, in such a neural network apparatus implemented by hardware, a value in binary may be sufficient for the weight used for inference. However, even when the weight used for the inference is binary, the weight used in a learning process needs to be a continuous value (multi-value) because it needs to be updated by a minute amount. For example, it is considered that the weight at the time of learning needs to have a precision of about 1000 values, for example, about 10 bits. Furthermore, it is preferable that the neural network apparatus implemented by hardware can update the weight at high speed at the time of learning.

DETAILED DESCRIPTION

A memory device storing weights used for arithmetic operation of a neural network according to an embodiment includes a first accumulation circuit, a second accumulation circuit, an update circuit, and an output circuit. The first accumulation circuit is configured to accumulate electric charges. The second accumulation circuit is configured to accumulate electric charges. The update circuit is configured to change, in accordance with an update amount for updating the weight, a difference between a charge amount accumulated in the first accumulation circuit and a charge amount accumulated in the second accumulation circuit. The output circuit is configured to output, as an output signal representing the weight, a signal corresponding to the difference between the charge amount accumulated in the first accumulation circuit and the charge amount accumulated in the second accumulation circuit. The update circuit performs the change of the difference by: changing, when the update amount is positive, the electric charges accumulated in the first accumulation circuit in a first direction by a charge amount corresponding to an absolute value of the update amount, the first direction being either an increasing direction or a decreasing direction; and changing, when the update amount is negative, the electric charges accumulated in the second accumulation circuit in the first direction by a charge amount corresponding to an absolute value of the update amount.

Hereinafter, a neural network apparatus 10 according to an embodiment will be described with reference to the drawings.

Figure 1:
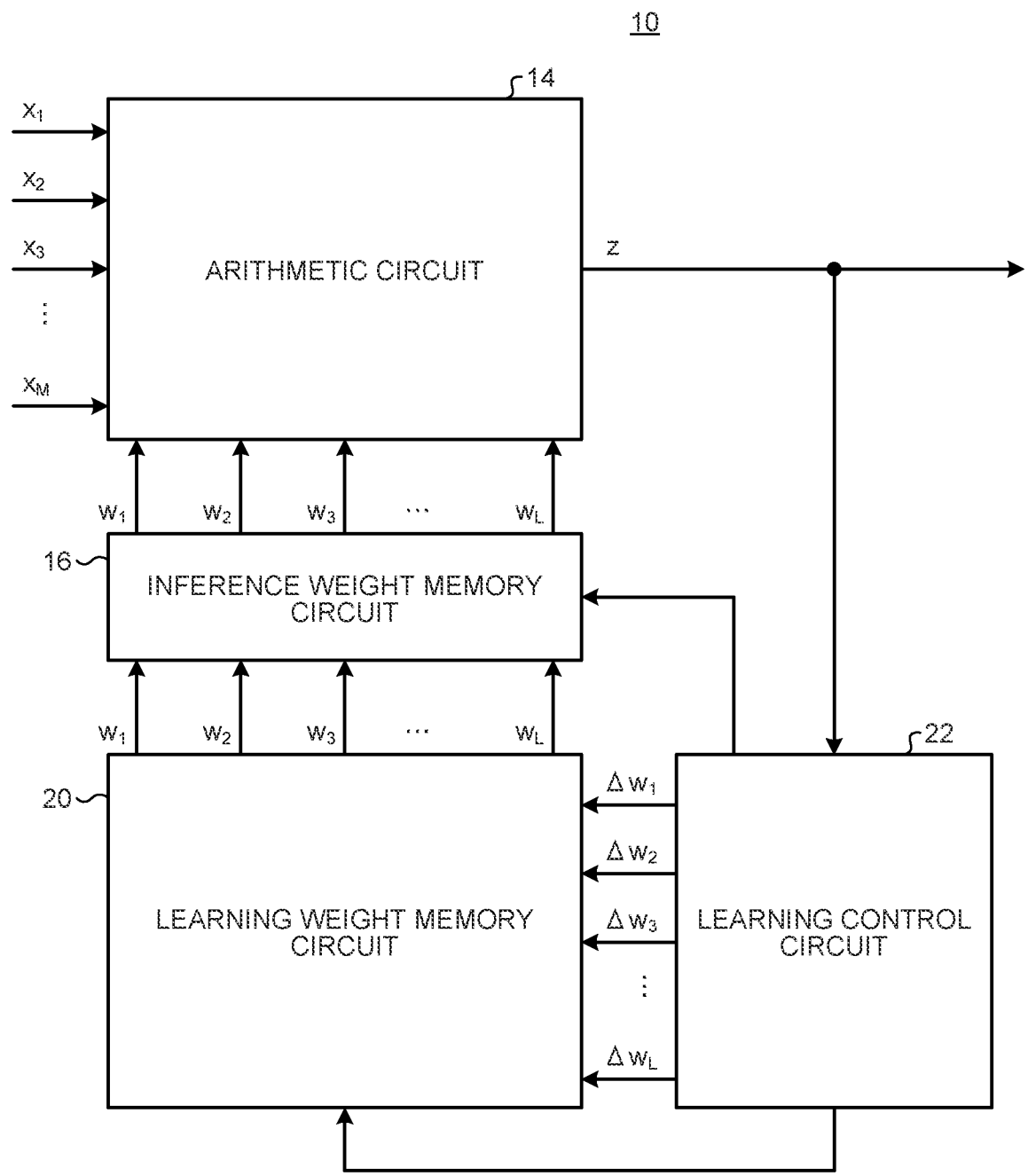
FIG. 1 is a diagram illustrating a configuration of a neural network apparatus according to an embodiment.

FIG. 1 is a diagram illustrating a configuration of the neural network apparatus 10 according to an embodiment. The neural network apparatus 10 includes an arithmetic circuit 14, an inference weight memory circuit 16, a learning weight memory circuit 20, and a learning control circuit 22.

The arithmetic circuit 14 executes arithmetic processing according to a neural network. The arithmetic circuit 14 is implemented with an electric circuit including an analog circuit. For example, the arithmetic circuit 14 receives M input signals $(x_1, \ldots, x_M)$ (M is an integer of 2 or more) and outputs an output signal (z). The arithmetic circuit 14 may output a plurality of output signals.

The inference weight memory circuit 16 stores a plurality of inference weights used in arithmetic processing according to the neural network by the arithmetic circuit 14. The inference weight memory circuit 16 stores L inference weights ($w_1, \ldots, w_L$) (L is an integer of 2 or more), for example. Each one of the plurality of inference weights is binary. This enables the arithmetic circuit 14 to execute, by the analog circuit, arithmetic processing according to the neural network at high speed by using a plurality of inference weights each of which is represented by binary. The inference weight memory circuit 16 includes, for example, a plurality of registers each of which stores a binary inference weight.

Furthermore, the inference weight memory circuit 16 can also realize a binary inference weight by a variable resistor or the like. In this case, the inference weight memory circuit 16 may be incorporated in the arithmetic circuit 14.

The learning weight memory circuit 20 stores a plurality of weights corresponding to a plurality of inference weights in the learning process of the neural network. The learning weight memory circuit 20 stores L weights ($w_1, \ldots, w_L$) which correspond one-to-one to L inference weights. Each one of the plurality of weights is a continuous value (that is, an analog amount).

In the learning process of the neural network, the learning control circuit 22 controls the learning weight memory circuit 20 to store initial values of a plurality of weights. Subsequently, the learning control circuit 22 repeats the update process a plurality of times. In the update process, the learning control circuit 22 generates an update amount ($\Delta w_1, \ldots, \Delta w_L$) corresponding to each one of the plurality of weights based on the result of operation obtained by the arithmetic circuit 14, and gives the generated update amount to the learning weight memory circuit 20 so as to update each one of the plurality of weights stored in the learning weight memory circuit 20. The number of times of execution of the update process by the learning control circuit 22 may be only one. After the learning process, the learning control circuit 22 controls the inference weight memory circuit 16 to store, as a plurality of inference weights, a plurality of values corresponding to the plurality of weights stored in the learning weight memory circuit 20.

In this manner, the learning control circuit 22 executes the learning process applied to the neural network by using a plurality of weights expressed in continuous values. This enables the learning control circuit 22 to increase or decrease each one of the plurality of weights by a minute amount in the learning process, making it possible to apply high-precision learning to the neural network.

Figure 2:
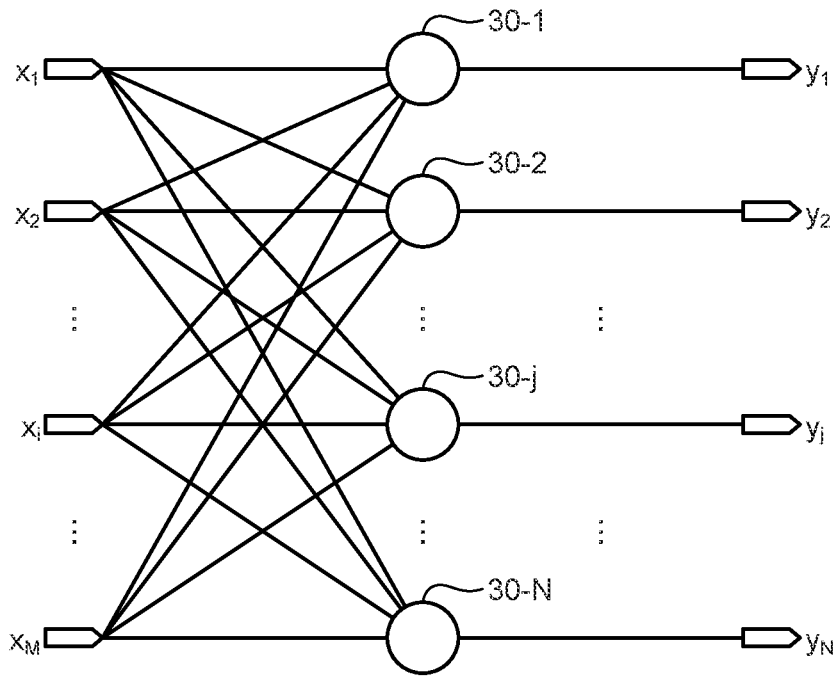
FIG. 2 is diagram illustrating one layer of a neural network.

FIG. 2 is diagram illustrating one layer of a neural network. The neural network includes, for example, one or more layers as illustrated in FIG. 2. The arithmetic circuit 14 includes a circuit that executes an arithmetic operation corresponding to a layer as illustrated in FIG. 2.

In order to execute layer operations as illustrated in FIG. 2, the arithmetic circuit 14 includes, for example, N product-sum operation circuits 30 (30-1 to 30-N) corresponding to N (N is an integer of 2 or more) intermediate signals ($y_1$ to $y_N$). The j-th product-sum operation circuit 30-$j$ (j is an arbitrary integer out of 1 to N) of the N product-sum operation circuits 30 corresponds to the j-th intermediate signal ($y_j$). Furthermore, each of the N product-sum operation circuits 30 receives M input signals ($x_1$ to $x_M$).

Figure 3:
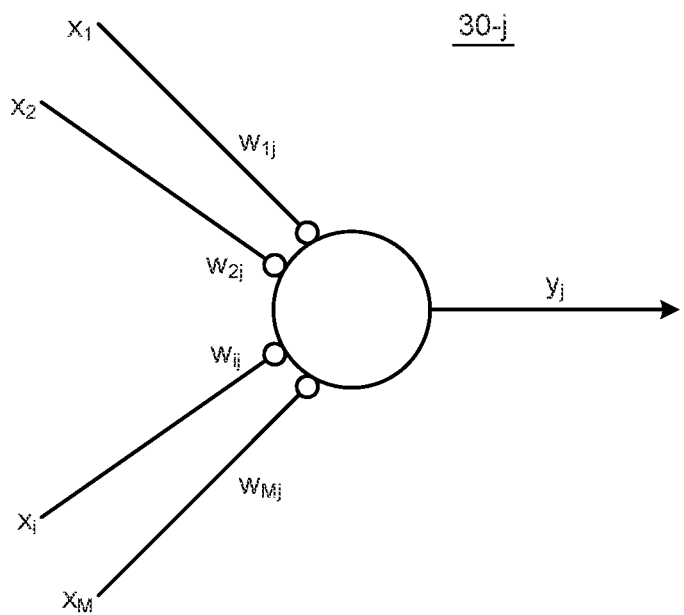
FIG. 3 is a diagram illustrating a product-sum operation performed by a product-sum operation circuit.

FIG. 3 is a diagram illustrating a product-sum operation performed by the product-sum operation circuit 30. Each of the N product-sum operation circuits 30 has M inference weights ($w_{1j}, w_{2j}, \ldots, w_{Mj}$) corresponding to M input signals from the inference weight memory circuit 16.

Each of the N product-sum operation circuits 30 outputs an intermediate signal which is generated by binarizing the value obtained with the product-sum operation of M input signals and M inference weights. For example, the product-sum operation circuit 30-$j$ corresponding to the j-th intermediate signal executes the arithmetic operation of the following Formula (1) in an analog operation.

$$y_j = f\left(\sum_{i=1}^{M} x_i w_{ij}\right) \quad (1)$$

In Formula (1), $y_j$ represents the j-th intermediate signal. $x_i$ represents the i-th input signal (i is an integer that is 1 or more and M or less). $w_{ij}$ represents an inference weight to be multiplied by the i-th input signal out of the M inference weights. In Formula (1), f(X) represents a function of binarizing a value X in parentheses with a predetermined threshold. Furthermore, bias (b) being a constant may be added to $y_j$.

Figure 4:
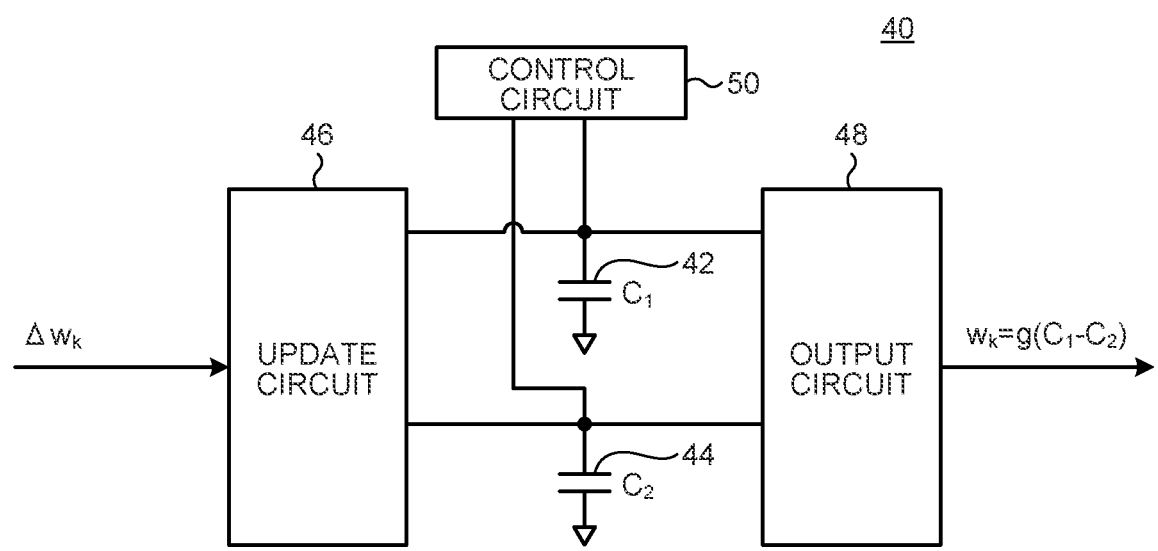
FIG. 4 is a diagram illustrating a configuration of one memory device included in a learning weight memory circuit.

FIG. 4 is a diagram illustrating a configuration of one memory device 40 included in the learning weight memory circuit 20. The learning weight memory circuit 20 includes a plurality of memory devices 40 corresponding to a plurality of weights. Each one of the plurality of memory devices 40 stores a continuous value (analog value) representing a corresponding weight.

Each one of the plurality of weights corresponds to a different one of the plurality of memory devices 40. Each one of the plurality of inference weights used for the arithmetic operation of the neural network is a value obtained by binarizing a weight that is a continuous value (analog value) stored in the corresponding memory device 40 among the plurality of memory devices 40.

While each one of the plurality of inference weights according to the present embodiment is a value obtained by binarizing the weight (analog value) stored in the corresponding memory device 40, the value may be a value obtained by converting the weight (analog value) into another notation values depending on the configuration of the arithmetic circuit 14. For example, each one of the plurality of inference weights may be a value obtained by ternarizing the weight (analog value) stored in the corresponding memory device 40, or may be a value obtained by converting the weight into four or more notation values.

The memory device 40 includes a first accumulation circuit 42, a second accumulation circuit 44, an update circuit 46, an output circuit 48, and a control circuit 50.

The first accumulation circuit 42 and the second accumulation circuit 44 each accumulate an electric charge. The first accumulation circuit 42 and the second accumulation circuit 44 may be capacitors having the same characteristic. In addition, the first accumulation circuit 42 and the second accumulation circuit 44 may be secondary batteries having the same characteristic.

The first accumulation circuit 42 and the second accumulation circuit 44 may each be any type of element as long as it is a device capable of storing an electric charge. For example, the first accumulation circuit 42 and the second accumulation circuit 44 may each be a capacitor element that can be manufactured by a Complementary Metal-Oxide-Semiconductor (CMOS) semiconductor process. Further, for example, the first accumulation circuit 42 and the second accumulation circuit 44 may each have a gate electrode structure of a Metal-Oxide-Semiconductor Field Effect Transistor (MOSFET). Furthermore, for example, the first accumulation circuit 42 and the second accumulation circuit 44 may each be a metal-insulator-metal (MIM) capacitor of a thin film stack type using a metal and an insulator that can be formed in a wiring layer manufactured in a CMOS semiconductor process. The MIM capacitor is a device having a layer structure of TiN/Ta$_2$O$_5$/TiN, for example. For example, the first accumulation circuit 42 and the second accumulation circuit 44 may each be an all-solid-state battery formed with an insulator having the MIM structure and being a solid electrolyte using Li$_3$PO$_4$, a nitrogen additive of Li$_3$PO$_4$, or the like, together with metal thin films using a material containing Li and structured with lithium titanate (Li$_2$TiO$_3$, Li$_2$Ti$_5$O$_{12}$, or the like) as a negative electrode and lithium cobaltate (LiCoO$_2$) as a positive electrode.

The first accumulation circuit 42 and the second accumulation circuit 44 store a weight (analog value) represented by a difference between charge amounts stored in these circuits. In other words, the weight stored in the memory device 40 is expressed by a difference between the charge amount accumulated in the first accumulation circuit 42 and the charge amount accumulated in the second accumulation circuit 44. Note that the weight may be represented by a difference obtained by subtracting the charge amount accumulated in the second accumulation circuit 44 from the charge amount accumulated in the first accumulation circuit 42, or may be represented by a difference obtained by subtracting the charge amount accumulated in the first accumulation circuit 42 from the charge amount accumulated in the second accumulation circuit 44.

At the time of learning, the update circuit 46 receives an update amount ($\Delta w_K$) for updating the stored weight. The update amount ($\Delta w_K$) may be, for example, a value calculated by a back propagation method. Furthermore, in a case where the weight is updated by spike timing dependent synaptic plasticity learning (STDP learning), the update circuit 46 receives a supervisory signal, a presynaptic spike, and a postsynaptic spike as signals representing the update amount ($\Delta w_K$). Note that the supervisory signal, the presynaptic spike, and the postsynaptic spike will be described in detail below with reference to FIG. 8 and the like.

Upon receiving the update amount ($\Delta w_K$), the update circuit 46 changes the difference between the charge amount accumulated in the first accumulation circuit 42 and the charge amount accumulated in the second accumulation circuit 44 according to the received update amount ($\Delta w_K$). More specifically, in a case where the update amount ($\Delta w_K$) is positive, the update circuit 46 changes the electric charges accumulated in the first accumulation circuit 42 in a first direction which is one of an increasing direction and a decreasing direction by the charge amount corresponding to the absolute value of the update amount ($\Delta w_K$). For example, in a case where the update amount ($\Delta w_K$) is positive, the update circuit 46 changes the charge accumulated in the first accumulation circuit 42 in the increasing direction by the charge amount corresponding to the absolute value of the update amount ($\Delta w_K$). Furthermore, in a case where the update amount ($\Delta w_K$) is positive, the update circuit 46 changes the electric charges accumulated in the first accumulation circuit 42 in the decreasing direction by the charge amount corresponding to the absolute value of the update amount ($\Delta w_K$). Note that update circuit 46 does not change the electric charges accumulated in the second accumulation circuit 44 when the update amount ($\Delta w_K$) is positive.

When the update amount ($\Delta w_K$) is negative, the update circuit 46 changes the electric charges accumulated in the second accumulation circuit 44 in the first direction by an amount corresponding to the absolute value of the update amount ($\Delta w_K$). When the electric charge is changed in the increasing direction in a case where the update amount ($\Delta w_K$) is positive, the update circuit 46 changes, in a case where the update amount ($\Delta w_K$) is negative, the charge accumulated in the second accumulation circuit 44 in the increasing direction by the charge amount corresponding to the absolute value of the update amount ($\Delta w_K$). When the electric charge is changed in the decreasing direction in a case where the update amount ($\Delta w_K$) is positive, the update circuit 46 changes, in a case where the update amount ($\Delta w_K$) is negative, the charge accumulated in the second accumulation circuit 44 in the decreasing direction by the charge amount corresponding to the absolute value of the update amount ($\Delta w_K$). Note that update circuit 46 does not change the charge accumulated in the first accumulation circuit 42 when the update amount ($\Delta w_K$) is negative.

The update circuit 46 supplies a preset current to either the first accumulation circuit 42 or the second accumulation circuit 44 for a time corresponding to the absolute value of the update amount ($\Delta w_K$), With this configuration, the update circuit 46 can change the electric charges accumulated in the first accumulation circuit 42 or the second accumulation circuit 44 in the increasing direction by the charge amount corresponding to the absolute value of the update amount ($\Delta w_K$). For example, by connecting the first accumulation circuit 42 or the second accumulation circuit 44 to a first potential (for example, the positive power supply voltage) via a resistor of a predetermined value for a time corresponding to the absolute value of the update amount ($\Delta w_K$), the update circuit 46 can apply the current so as to change the electric charge in the increasing direction.

In addition, the update circuit 46 causes either the first accumulation circuit 42 or the second accumulation circuit 44 to emit a preset current for a time corresponding to the absolute value of the update amount ($\Delta w_K$). With this configuration, the update circuit 46 can change the electric charges accumulated in the first accumulation circuit 42 or the second accumulation circuit 44 in the decreasing direction by the charge amount corresponding to the absolute value of the update amount ($\Delta w_K$). For example, by connecting the first accumulation circuit 42 or the second accumulation circuit 44 to a second potential (for example, the negative power supply voltage) lower than the first potential via a resistor of a predetermined value for a time corresponding to the absolute value of the update amount ($\Delta w_K$), the update circuit 46 can apply the current so as to change the electric charge in the decreasing direction.

In addition, for example, the update circuit 46 supplies electric charges to the first accumulation circuit 42 or the second accumulation circuit 44 the number of times corresponding to the absolute value of the update amount ($\Delta w_K$), by using a transfer capacitor having a preset capacitance. With this configuration, the update circuit 46 can change the electric charges accumulated in the first accumulation circuit 42 or the second accumulation circuit 44 in the increasing direction by the charge amount corresponding to the absolute value of the update amount ($\Delta w_K$).

For example, the update circuit 46 first connects the transfer capacitor to the positive power supply voltage, thereby allowing the transfer capacitor to accumulate the electric charge having the maximum capacitance. Subsequently, the update circuit 46 disconnects the transfer capacitor and the positive power supply voltage from each other. Subsequently, the update circuit 46 connects the transfer capacitor to the first accumulation circuit 42 or the second accumulation circuit 44 to transfer the electric charges accumulated in the transfer capacitor to the first accumulation circuit 42 or the second accumulation circuit 44 so as to set the electric charge of the transfer capacitor to 0. The update circuit 46 then disconnects the transfer capacitor from the first accumulation circuit 42 or the second accumulation circuit 44. The update circuit 46 can control the charge amount in the increasing direction by executing the bucket-brigade type charge transfer as many times as the absolute value of the update amount ($\Delta w_K$).

In addition, for example, the update circuit 46 uses the transfer capacitor to emit the electric charge from the first accumulation circuit 42 or the second accumulation circuit 44 by the number of times corresponding to the absolute value of the update amount ($\Delta w_K$). With this configuration, the update circuit 46 can change the electric charges accumulated in the first accumulation circuit 42 or the second accumulation circuit 44 in the decreasing direction by the charge amount corresponding to the absolute value of the update amount ($\Delta w_K$).

For example, by first connecting the transfer capacitor to the negative power supply voltage, the update circuit 46 sets the charge accumulated in the transfer capacitor to 0. Subsequently, the update circuit 46 disconnects the transfer capacitor and the negative power supply voltage from each other. Subsequently, by connecting the transfer capacitor to the first accumulation circuit 42 or the second accumulation circuit 44, the update circuit 46 transfers the charge accumulated in the first accumulation circuit 42 or the second accumulation circuit 44 to the transfer capacitor so as to accumulate the charge of the maximum capacitance in the transfer capacitor. The update circuit 46 then disconnects the transfer capacitor from the first accumulation circuit 42 or the second accumulation circuit 44. The update circuit 46 can control the charge amount in the decreasing direction by executing the bucket-brigade type charge transfer as many times as the absolute value of the update amount ($\Delta w_K$).

The output circuit 48 outputs a signal corresponding to a difference between the charge amount accumulated in the first accumulation circuit 42 and the charge amount accumulated in the second accumulation circuit 44 as an output signal ($w_K$) representing a weight.

The output circuit 48 outputs an output signal corresponding to a potential difference between the voltage of the first accumulation circuit 42 and the voltage of the second accumulation circuit 44. When the first accumulation circuit 42 and the second accumulation circuit 44 are capacitors, the voltage (V) generated by the first accumulation circuit 42 and the second accumulation circuit 44 is calculated as: charge amount (Q)×capacitance (C). That is, the first accumulation circuit 42 and the second accumulation circuit 44, in a case where they are capacitors, generate voltage proportional to the accumulated charge amount. Therefore, in a case where the first accumulation circuit 42 and the second accumulation circuit 44 are capacitors having the same characteristic, the output circuit 48 can output an output signal corresponding to the difference in the accumulated charge amounts by detecting the voltage difference.

In addition, the secondary battery has a characteristic that the generated voltage changes linearly with respect to the accumulated charges when the accumulated charges are within a predetermined range. Therefore, in a case where the first accumulation circuit 42 and the second accumulation circuit 44 are secondary batteries having the same characteristics, the output circuit 48 can output an output signal corresponding to the difference in the accumulated charge amounts by detecting the voltage difference.

The output circuit 48 is a comparator, for example. In this case, the output circuit 48 can output an output signal obtained by binarizing the stored weight. In addition, the output circuit 48 may be a D-flip-flop circuit that outputs an output signal of logic according to positive and negative of voltages applied to two input terminals, or may be an S-R latch circuit. In addition, the output circuit 48 may be a circuit having the same configuration as a static random access memory (SRAM) cell that changes an internal voltage state according to positive and negative of the voltages applied to two bit lines.

In addition, the output circuit 48 may output an output signal of an analog voltage according to a potential difference between the voltage of the first accumulation circuit 42 and the voltage of the second accumulation circuit 44. In addition, the output circuit 48 may output a differential output signal according to the potential difference between the voltage of the first accumulation circuit 42 and the voltage of the second accumulation circuit 44. In addition, the output circuit 48 may output an output signal representing a multi-level digital value obtained by digitizing, by an AD converter, the potential difference between the voltage of the first accumulation circuit 42 and the voltage of the second accumulation circuit 44.

At the time of initialization, the control circuit 50 controls the first accumulation circuit 42 and the second accumulation circuit 44 to each accumulate electric charges of a preset amount or a random amount. For example, at the time of initialization of a learning process, the learning control circuit 22 might set each one of the plurality of weights to a predetermined value or a random value. In such a case, the control circuit 50 can set the corresponding weight to the predetermined value or the random value by controlling the first accumulation circuit 42 and the second accumulation circuit 44 to each accumulate electric charges.

In addition, in a learning period, the control circuit 50 changes, by a preset amount, the electric charge accumulated in the first accumulation circuit 42 and the electric charge accumulated in the second accumulation circuit 44 in a second direction which is different from the first direction among an increasing direction and a decreasing direction. For example, the control circuit 50 may change periodically, for example, at regular intervals, the electric charge accumulated in the first accumulation circuit 42 and the electric charge accumulated in the second accumulation circuit 44 in the second direction by a preset amount. Furthermore, for example, every time a predetermined event occurs, the control circuit 50 may change the electric charge accumulated in the first accumulation circuit 42 and the electric charge accumulated in the second accumulation circuit 44 in the second direction by a preset amount.

When the update circuit 46 changes the electric charge in the decreasing direction, the electric charge accumulated in the first accumulation circuit 42 and the second accumulation circuit 44 approaches 0. During the change of the electric charge in the decreasing direction, the update circuit 46 cannot update the weight in the increasing direction after the electric charge accumulated in the first accumulation circuit 42 becomes 0. Similarly, during the change of the electric charge in the decreasing direction, the update circuit 46 cannot update the weight in the decreasing direction after the electric charge accumulated in the second accumulation circuit 44 becomes 0.

On the other hand, when the update circuit 46 changes the electric charge in the increasing direction, the electric charge accumulated in the first accumulation circuit 42 and the second accumulation circuit 44 approaches the maximum capacitance. During the change of the electric charge in the increasing direction, the update circuit 46 cannot update the weight in the increasing direction after the electric charge accumulated in the first accumulation circuit 42 becomes the maximum capacitance. Similarly, during the change of the electric charge in the increasing direction, the update circuit 46 cannot update the weight in the decreasing direction after the electric charge accumulated in the second accumulation circuit 44 becomes the maximum capacitance.

In contrast, in a learning period, the control circuit 50 changes, by a preset amount, the electric charge accumulated in the first accumulation circuit 42 and the electric charge accumulated in the second accumulation circuit 44 in a second direction differing from the first direction. Therefore, the control circuit 50 allows the update circuit 46 to further update the weight while maintaining the difference between the electric charge stored in the first accumulation circuit 42 and the electric charge accumulated in the second accumulation circuit 44. As a result, the control circuit 50 can continue the weight update by the update circuit 46 with high precision for a long period of time.

Similarly to the update circuit 46, for example, the control circuit 50 executes the initialization process and a process of changing the charge amount in the second direction by using a preset current or transfer capacitor. This enables the control circuit 50 to perform high-precision control of the charges accumulated in each of the first accumulation circuit 42 and the second accumulation circuit 44.

Figure 5:
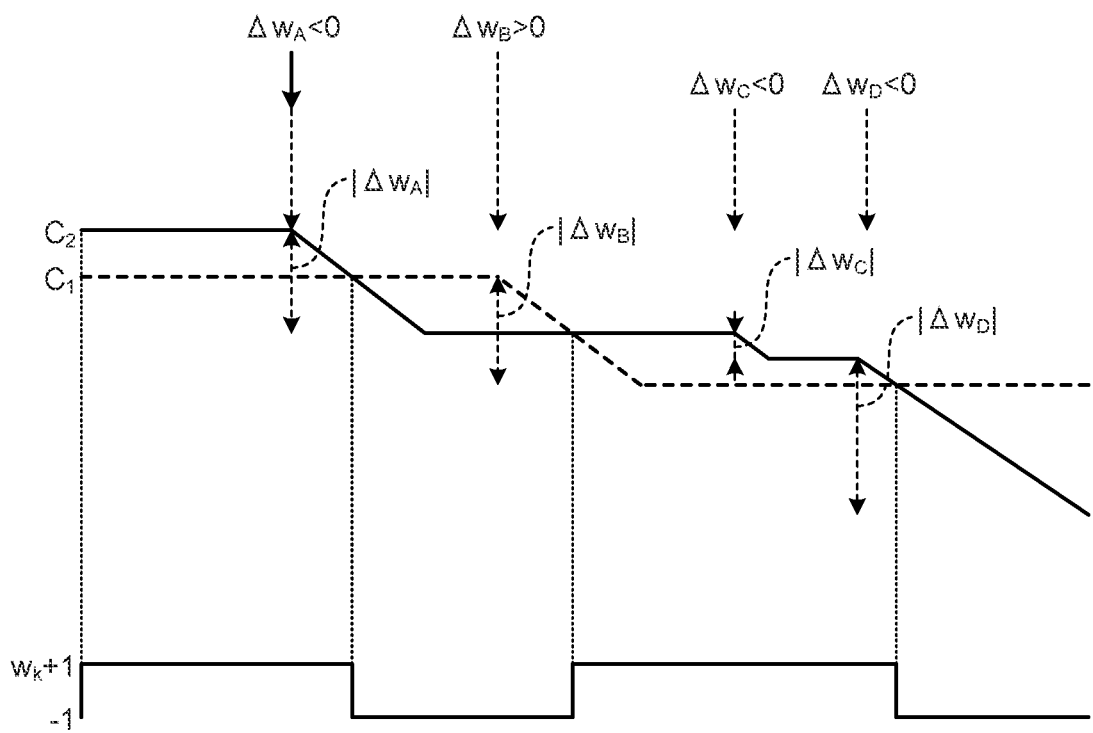
FIG. 5 is a diagram illustrating an example of operation of a memory device.

FIG. 5 is a diagram illustrating an example of operation of the memory device 40.

In a case where the update amount ($\Delta w_K$) is positive, the update circuit 46 is supposed to change the electric charge accumulated in the first accumulation circuit 42 in the decreasing direction (first direction) by the charge amount corresponding to the absolute value of the update amount ($\Delta w_K$). Moreover, in a case where the update amount ($\Delta w_K$) is negative, the update circuit 46 is supposed to change the electric charge accumulated in the second accumulation circuit 44 in the decreasing direction (first direction) by the amount corresponding to the absolute value of the update amount ($\Delta w_K$). In such a case, as an example, the electric charge ($C_1$) accumulated in the first accumulation circuit 42 and the electric charge ($C_2$) accumulated in the second accumulation circuit 44 change as illustrated in FIG. 5 every time the update circuit 46 receives the update amount ($\Delta w_K$).

In such a case, in a case where the electric charge ($C_1$) accumulated in the first accumulation circuit 42 is less than or equal to the electric charge ($C_2$) accumulated in the second accumulation circuit 44, the output circuit 48 outputs an output signal indicating a weight ($w_K$) of +1. In addition, in a case where the electric charge ($C_2$) accumulated in the second accumulation circuit 44 is less than the electric charge ($C_1$) accumulated in the first accumulation circuit 42, the output circuit 48 outputs an output signal indicating a weight ($w_K$) of −1.

Not limited to the operation as illustrated in FIG. 5, the memory device 40 may be configured to change the electric charges accumulated in the first accumulation circuit 42 and the second accumulation circuit 44 in the increasing direction.

Figure 6:
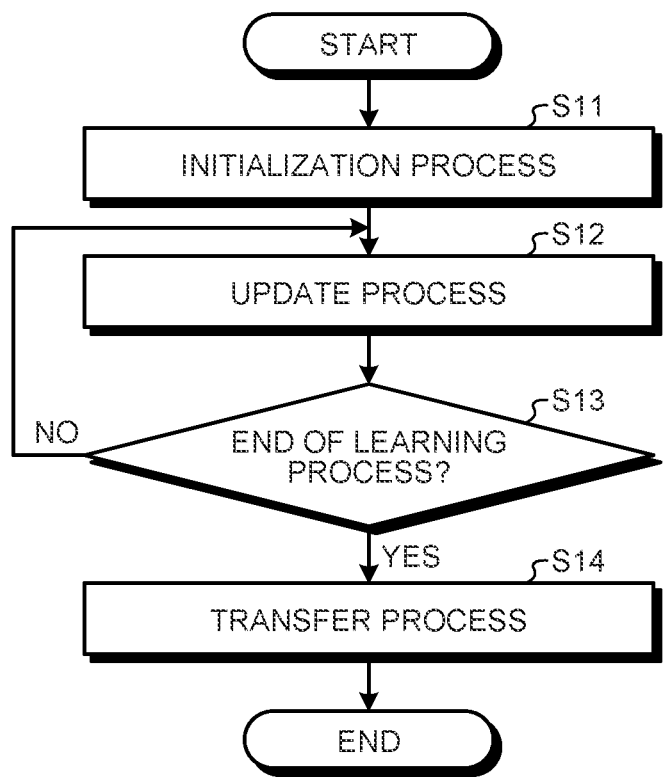
FIG. 6 is a flowchart illustrating an operation flow of a learning weight memory circuit.

FIG. 6 is a flowchart illustrating an operation flow of the learning weight memory circuit 20. The learning weight memory circuit 20 operates in the flow illustrated in FIG. 6 in accordance with the instruction from the learning control circuit 22 in the learning process.

First, in S11, the learning weight memory circuit 20 receives an initialization instruction and initial values of each one of the plurality of weights from the learning control circuit 22, and executes the initialization process. In the initialization process, the learning weight memory circuit 20 causes each one of the plurality of memory devices 40 to store the weight corresponding to the received initial value. The learning weight memory circuit 20 may control to store a weight of a random value for each one of the plurality of memory devices 40 without receiving the initial value in the initialization process.

Subsequently, in S12, the learning weight memory circuit 20 receives an update instruction and an update amount ($\Delta w_K$) for each one of the plurality of weights from the learning control circuit 22, and executes an update process. In the update process, the learning weight memory circuit 20 gives the corresponding update amount ($\Delta w_K$) to each one of the plurality of memory devices 40 to update the stored weight. This enables the learning weight memory circuit 20 to change the weight stored in each one of the plurality of memory device 40 by the update amount ($\Delta w_K$).

The learning weight memory circuit 20 repeats the process of S12 until the learning process is completed (No of S13). This enables the learning weight memory circuit 20 to optimize a plurality of weights. After completion of the learning process (Yes in S13), the learning weight memory circuit 20 proceeds to the process of S14.

In S14, the learning weight memory circuit 20 receives a transfer instruction from the learning control circuit 22 and executes a transfer process. In the transfer process, the learning weight memory circuit 20 outputs the output signal output from each one of the plurality of memory devices 40 to the inference weight memory circuit 16. After completion of the process of S14, the learning weight memory circuit 20 ends the present flow.

Figure 7:
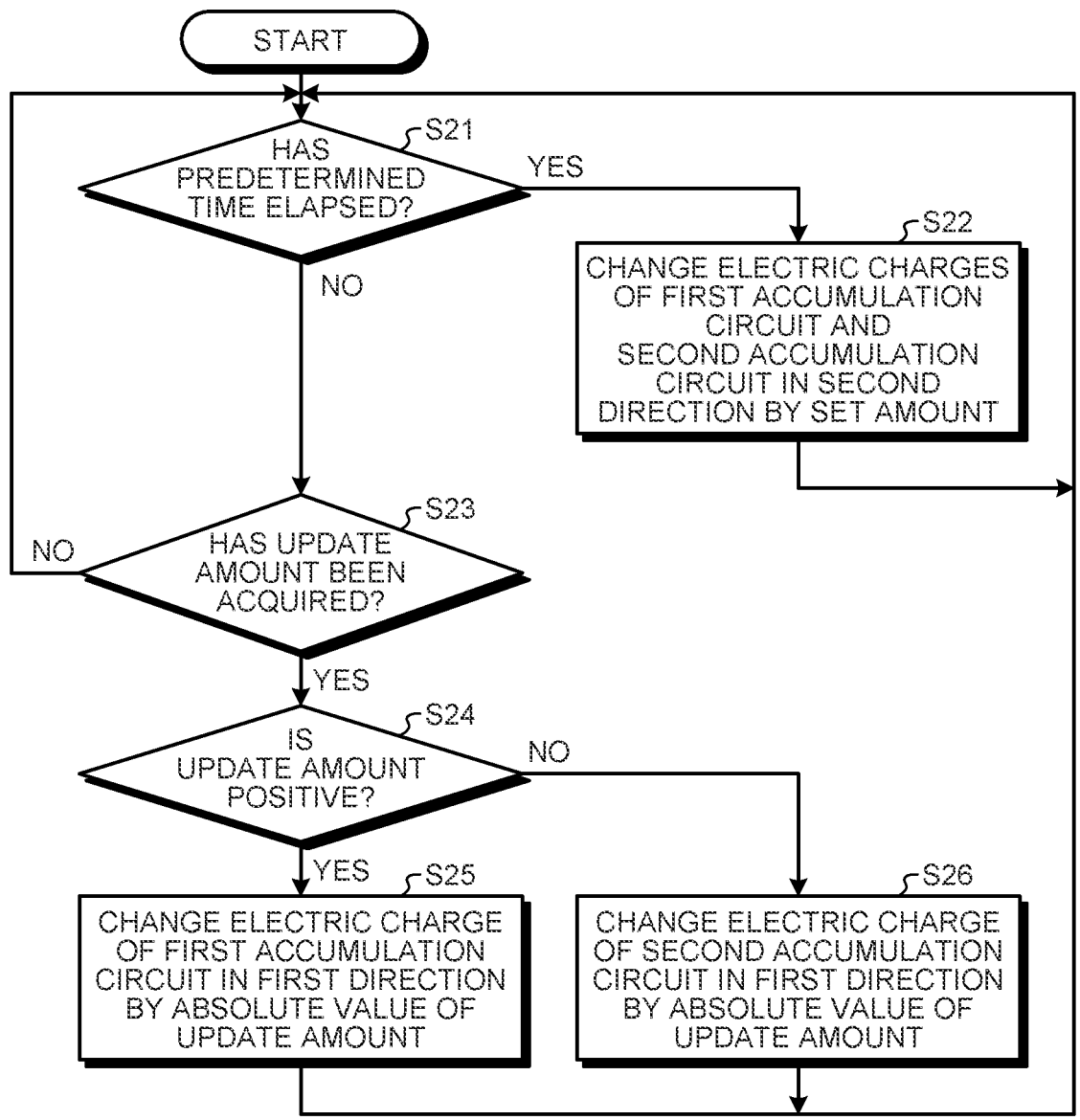
FIG. 7 is a flowchart illustrating a processing flow of a memory device.

FIG. 7 is a flowchart illustrating a processing flow of the memory device 40. Each one of the plurality of memory devices 40 included in the learning weight memory circuit 20 operates in the flow illustrated in FIG. 7 in the update process of S12.

First, in S21, the memory device 40 determines whether a predetermined time has elapsed after executing the process of S22. Note that, in a case where the process of S22 has not yet been executed since the start of learning, the memory device 40 determines whether a predetermined time has elapsed from the start of learning. In response to determining that the predetermined time has not elapsed (No in S21), the memory device 40 proceeds to the process of S23. In response to determining that the predetermined time has elapsed (Yes in S21), the memory device 40 proceeds to the process of S22. Note that the memory device 40 may proceed to the process of S22 when a preset event has occurred in S21, and may proceed to the process of S23 when the preset event has not occurred.

In S22, the memory device 40 changes the charges of the first accumulation circuit 42 and the second accumulation circuit 44 in the second direction by a preset amount. This enables the memory device 40 to continue the weight update with high precision for a long period of time. Having finished the process of S22, the memory device 40 returns to the process of S21.

In S23, the memory device 40 determines whether the update amount ($\Delta w_K$) has been acquired. In response to determining that the update amount ($\Delta w_K$) has not been acquired (No in S23), the memory device 40 returns to the process of S21 and repeats the process from S21. In response to determining that the update amount ($\Delta w_K$) has been acquired (Yes in S23), the memory device 40 proceeds to the process of S24.

In S24, the memory device 40 determines whether the acquired update amount ($\Delta w_K$) is positive. In response to determining that the acquired update amount ($\Delta w_K$) is positive (Yes in S24), the memory device 40 proceeds to the process of S25. In response to determining that the acquired update amount ($\Delta w_K$) is negative (No in S25), the memory device 40 proceeds to the process of S26.

In S25, the memory device 40 changes the electric charge accumulated in the first accumulation circuit 42 in the first direction by the charge amount corresponding to the absolute value of the update amount ($\Delta w_K$), For example, in S25, the update circuit 46 changes the electric charge accumulated in the first accumulation circuit 42 in the increasing direction by the charge amount corresponding to the absolute value of the update amount ($\Delta w_K$). Furthermore, for example, the update circuit 46 may change in S25 the charge accumulated in the first accumulation circuit 42 in the decreasing direction by the charge amount corresponding to the absolute value of the update amount ($\Delta w_K$). In S25, update circuit 46 does not change the charge accumulated in the second accumulation circuit 44.

In S26, the memory device 40 changes the electric charge accumulated in the second accumulation circuit 44 in the first direction by an amount corresponding to the absolute value of the update amount ($\Delta w_K$). For example, in a case of changing the electric charge in the increasing direction in S25, the update circuit 46 changes in S26 the electric charge accumulated in the second accumulation circuit 44 in the increasing direction by the charge amount corresponding to the absolute value of the update amount ($\Delta w_K$). In addition, for example, in a case of changing the electric charge in the decreasing direction in S25, the update circuit 46 changes in S26 the electric charge accumulated in the second accumulation circuit 44 in the decreasing direction by the charge amount corresponding to the absolute value of the update amount ($\Delta w_K$). Note that, in S26, the update circuit 46 does not change the charge accumulated in the first accumulation circuit 42.

Having finished the process of S25 or S26, the memory device 40 returns to the process of S21.

As described above, the memory device 40 according to the present embodiment stores the weight represented by the difference between the charge amount accumulated in the first accumulation circuit 42 and the charge amount accumulated in the second accumulation circuit 44. This enables the memory device 40 to store weights being continuous values. Furthermore, the memory device 40 performs control in a direction of increasing the weight and a direction of decreasing the weight only in either one of the increasing direction or the decreasing direction of the electric charge. With this configuration, the memory device 40 can update the weight simply with high precision and at high speed.

Figure 8:
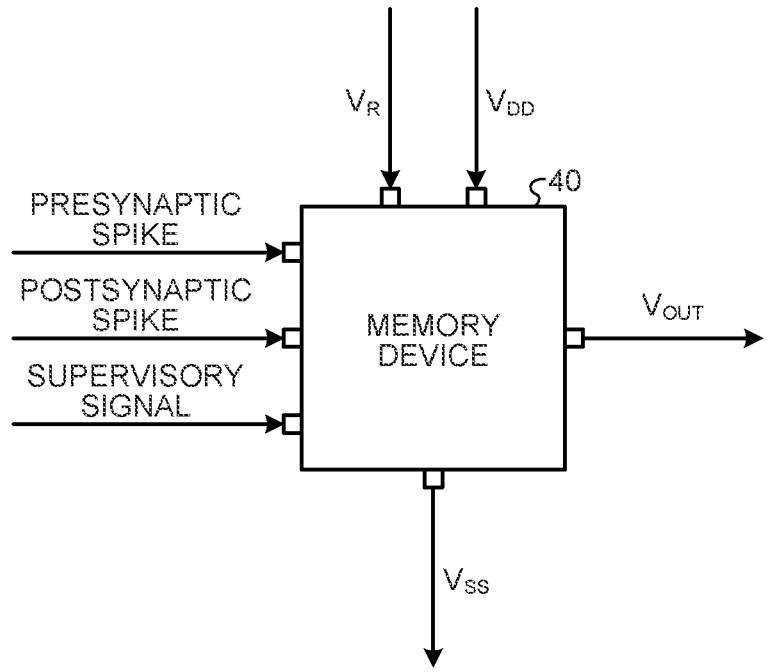
FIG. 8 is a diagram illustrating a memory device to which STDP learning is applied.

FIG. 8 is a diagram illustrating the memory device 40 to which STDP learning is applied. There has been a proposed technique of implementing a neuromorphic (brain-inspired) processor using a neural network formed with hardware. Such a neuromorphic processor has a plurality of neuron circuits and a plurality of synaptic circuits. Each one of the plurality of synaptic circuits holds a weight, and is configured to give, to a postsynaptic neuron, a signal obtained by adding influence of the weight to a signal coming from a presynaptic neuron.

In a case where the neural network apparatus 10 is applied to such a neuromorphic processor, each one of the plurality of inference weights stored in the inference weight memory circuit 16 functions as a synaptic weight to be set to one of the plurality of synaptic circuits. In this case, the weight stored in each one of the plurality of memory devices 40 functions as a learning weight to be used at the time of learning the synaptic weight set in the synaptic circuit.

Furthermore, in a case where the neural network apparatus 10 is applied to such a neuromorphic processor, the weight stored in each one of the plurality of memory devices 40 may be updated by STDP learning. In the memory device 40 to which STDP learning is applied, a supervisory signal, a presynaptic spike, and a postsynaptic spike are provided as signals representing the update amount ($\Delta w_K$).

The supervisory signal is a binary signal indicating that an input signal is being given to the neural network at the time of learning. The supervisory signal indicates first logic (in the present embodiment, logic-H) in a period during which an input signal is given to the neural network, and indicates second logic (for example, logic-L in the present embodiment), which is different from the first logic, in a period during which no input signal is given to the neural network. Note that the first logic may be logic-L and the second logic may be logic-H.

The presynaptic spike is a signal indicating an occurrence of firing of a presynaptic neuron arranged in the previous stage of the corresponding synaptic circuit. For example, the presynaptic spike indicates the first logic (for example, the logic-H) from the timing of firing of the presynaptic neuron until the lapse of a preset delay time, and indicates the second logic (for example, the logic-L) in other periods.

The postsynaptic spike is a signal indicating an occurrence of firing of a postsynaptic neuron arranged in a subsequent stage of the corresponding synaptic circuit. For example, the postsynaptic spike indicates the first logic (for example, the logic-H) from the timing of firing of the postsynaptic neuron until the lapse of a preset delay time, and indicates the second logic (for example, the logic-L) in other periods.

In performing the STDP learning, the memory device 40 changes the stored weight by the length of period in which both the presynaptic spike and the postsynaptic spike are indicating the first logic (for example, the logic-H). In this case, the memory device 40 changes the weight in the increasing direction in a period during which the supervisory signal indicates the first logic (for example, the logic-H), and changes the weight in the decreasing direction in a period during which the supervisory signal indicates the second logic (for example, the logic-L).

By executing such STDP learning, the memory device 40 increases the weight in a case where both of the presynaptic neuron and the postsynaptic neuron have fired due to the supply of the input signal. By contrast, when both the presynaptic neuron and the postsynaptic neuron have fired irrespective of the input signal, the memory device 40 decreases the weight. With this configuration, the memory device 40 can increase the weight of the synapse whose previous stage and subsequent stage neurons have fired in association with the supply of the input signal, and can decrease the weight of the synapse whose previous and subsequent neurons have fired irrespective of the input signal.

In the present embodiment, in order to execute such STDP learning, a positive power supply voltage ($V_{DD}$), a negative power supply voltage ($V_{SS}$), and a reset signal ($V_R$) being a voltage signal are applied to the memory device 40. The positive power supply voltage ($V_{DD}$) and the negative power supply-voltage ($V_{SS}$) are voltages that supply electric power for driving the memory device 40. The reset signal ($V_R$) is a voltage for initializing electric charges accumulated in the first accumulation circuit 42 and the second accumulation circuit 44 and for supplying or emitting a predetermined amount of electric charge every predetermined time or every time a predetermined event occurs. Furthermore, in the present embodiment, the memory device 40 outputs an output signal ($V_{OUT}$) indicating a weight at a voltage level.

Figure 9:
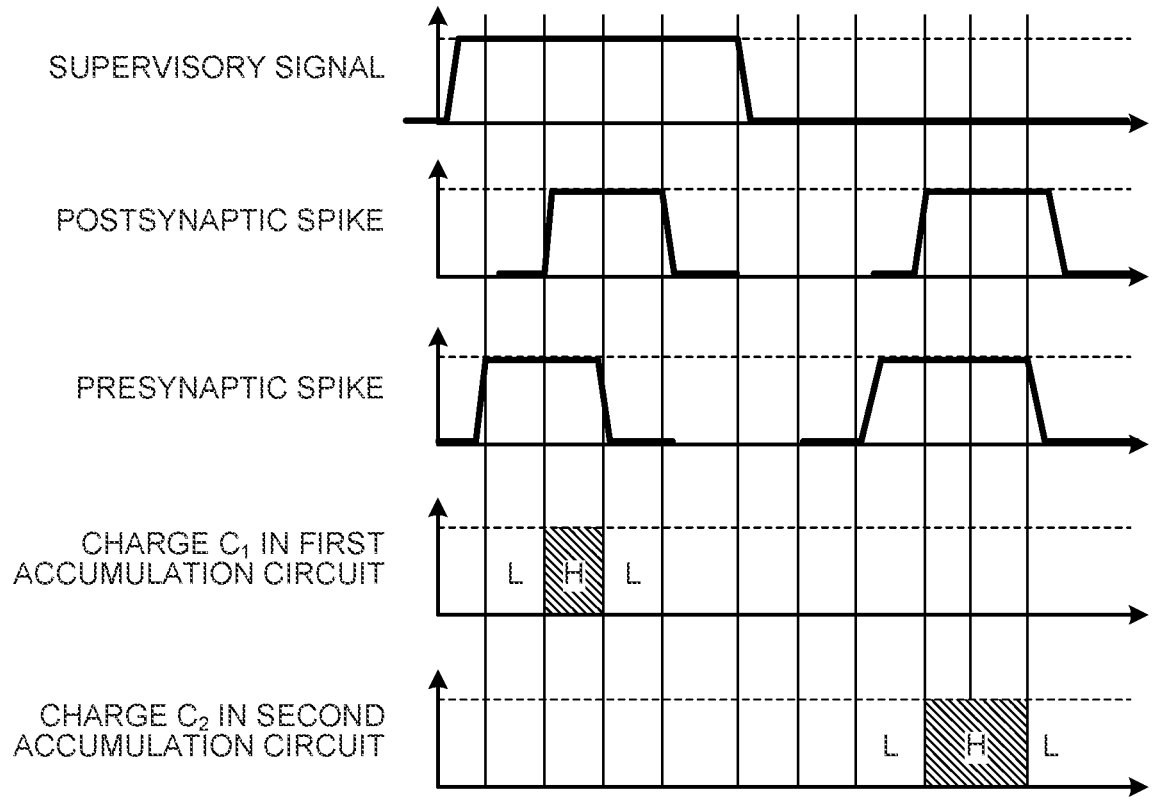
FIG. 9 is a diagram illustrating an example of a timing chart of signals used in STDP learning.

FIG. 9 is a diagram illustrating an example of a timing chart of a signal used in STDP learning and a charge change period.

In the STDP learning, the weight is increased when the supervisory signal indicates the first logic, and the weight is decreased when the supervisory signal indicates the second logic. Accordingly, the supervisory signal represents a sign of the update amount ($\Delta w_K$).

In addition, in the STDP learning, the weight is controlled to increase or decrease by the length of the period during which both the presynaptic spike and the postsynaptic spike indicate the first logic. Accordingly, the length of the period during which both the presynaptic spike and the postsynaptic spike indicates the first logic represents the absolute value of the update amount ($\Delta w_K$).

The memory device 40 with such a configuration supplies a current of a predetermined value to the first accumulation circuit 42 in a period during which the supervisory signal indicates the first logic, the presynaptic spike indicates the first logic, and the postsynaptic spike indicates the first logic; and supplies a current of a predetermined value to the second accumulation circuit 44 in a period during which the supervisory signal indicates the second logic, the presynaptic spike indicates the first logic, and the postsynaptic spike indicates the first logic. Alternatively, the memory device 40 with this configuration emits a current of a predetermined value from the first accumulation circuit 42 in a period during which the supervisory signal indicates the first logic, the presynaptic spike indicates the first logic, and the postsynaptic spike indicates the first logic; and emits a current of a predetermined value from the second accumulation circuit 44 in a period during which the supervisory signal indicates the second logic, the presynaptic spike indicates the first logic, and the postsynaptic spike indicates the first logic.

With this configuration, in a case where the update amount ($\Delta w_K$) is positive in the STDP learning, the memory device 40 can change the electric charge accumulated in the first accumulation circuit 42 in a first direction, which is either one of an increasing direction or a decreasing direction, by the charge amount corresponding to the absolute value of the update amount ($\Delta w_K$). When the update amount ($\Delta w_K$) is negative, the memory device 40 can change the electric charge accumulated in the second accumulation circuit 44 in the first direction by an amount corresponding to the absolute value of the update amount ($\Delta w_K$).

Figure 10:
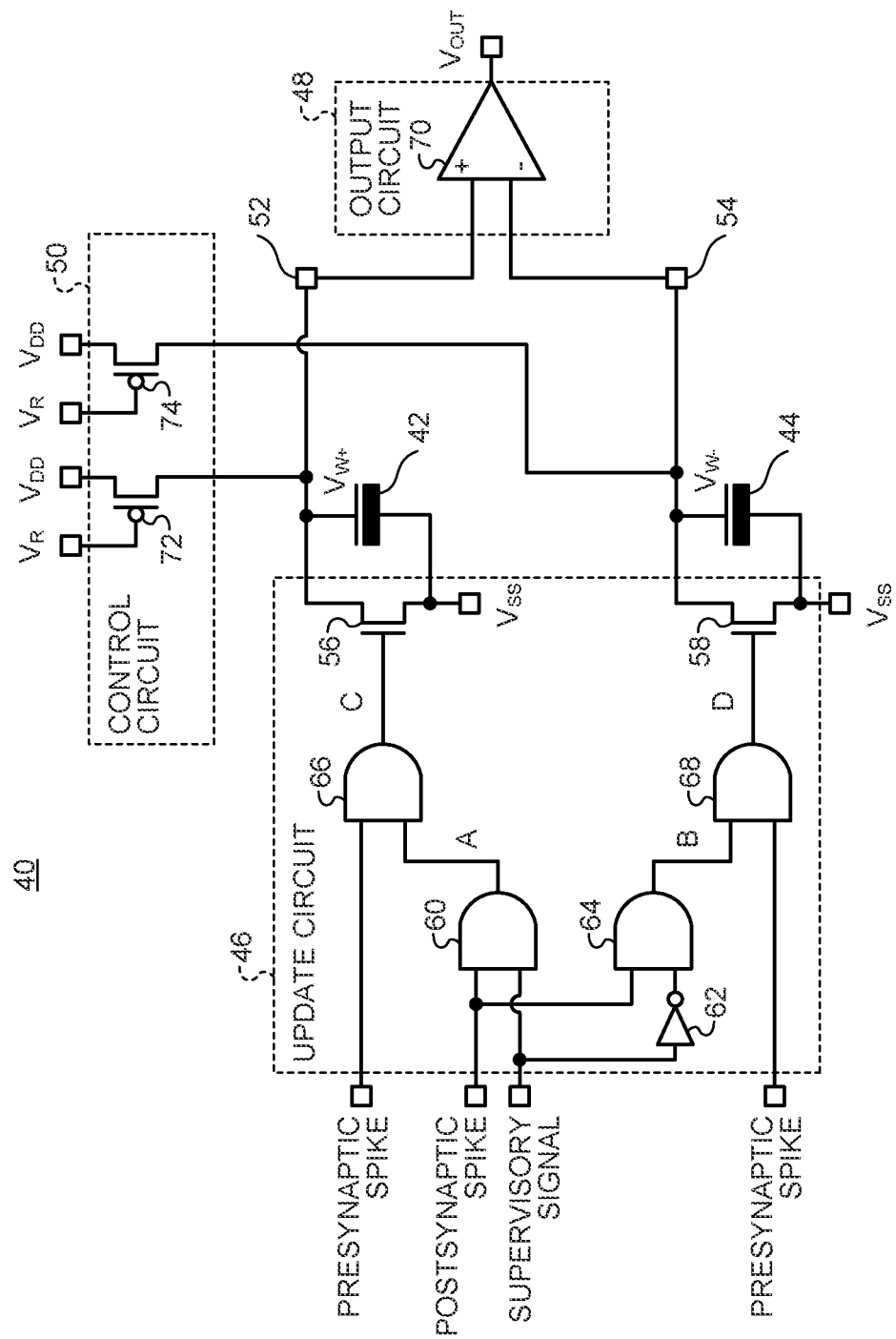
FIG. 10 is a diagram illustrating a first configuration example of a memory device on which STDP learning is applied.
Figure 11:
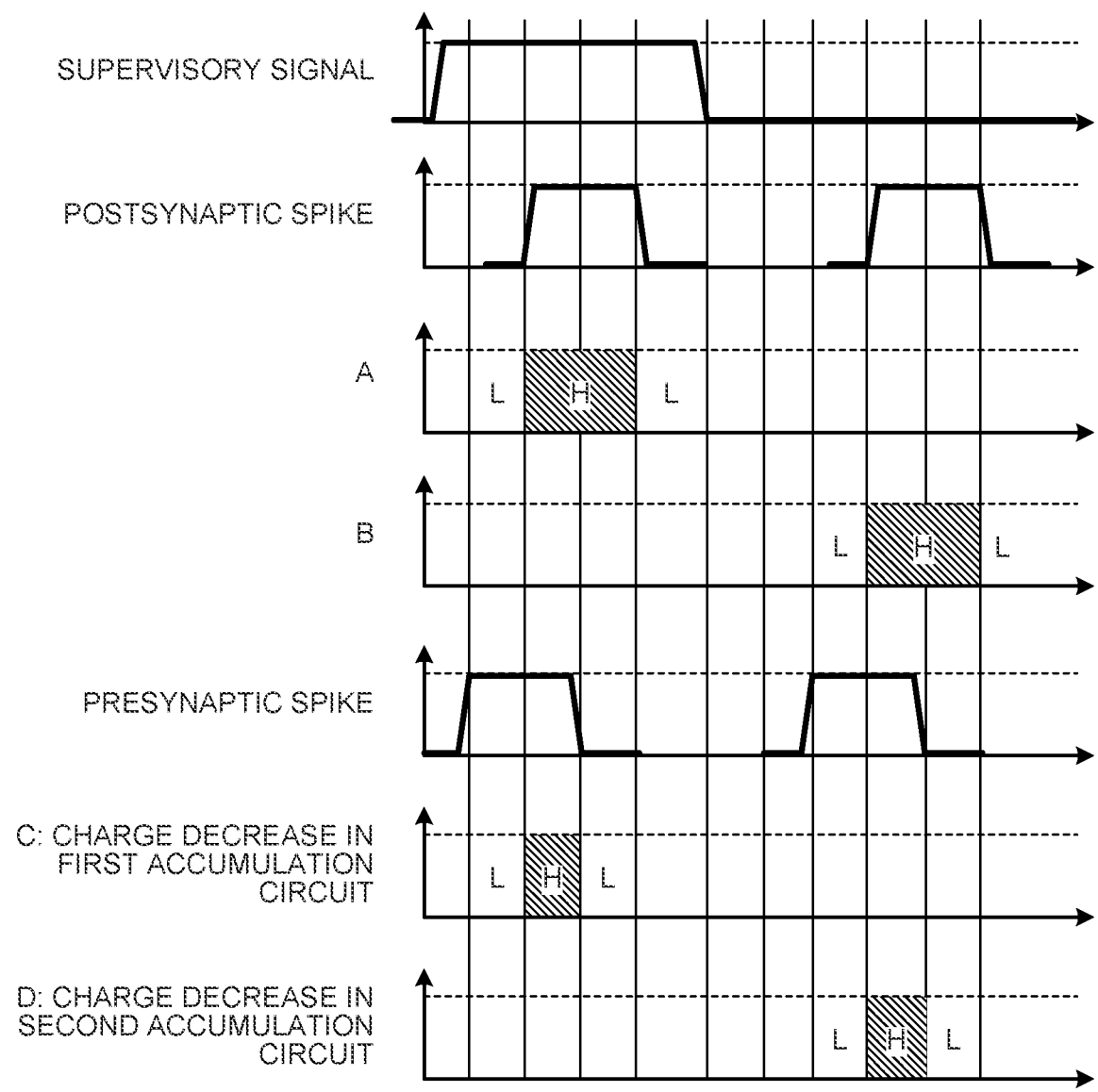
FIG. 11 is a diagram illustrating an example of a timing of a signal inside a memory circuit.

FIG. 10 is a diagram illustrating a first circuit example of the memory device 40 on which STDP learning is applied. FIG. 11 is a diagram illustrating an example of a timing chart of signals provided to the memory device 40 and internal signals. For example, the memory device 40 on which STDP learning is applied can be implemented by the first circuit example illustrated in FIG. 10.

When the first accumulation circuit 42 according to the first example is a capacitor, one terminal is connected to a first voltage terminal 52 while the other terminal is connected to the negative power supply voltage ($V_{SS}$). When the first accumulation circuit 42 according to the first example is a secondary battery, the positive electrode is connected to the first voltage terminal 52, and the negative electrode is connected to the negative power supply voltage ($V_{SS}$).

When the second accumulation circuit 44 according to the first example is a capacitor, one terminal is connected to a second voltage terminal 54, and the other terminal is connected to the negative power supply voltage ($V_{SS}$). When the second accumulation circuit 44 according to the first example is a secondary battery, the positive electrode is connected to the second voltage terminal 54 while the negative electrode is connected to the negative power supply voltage ($V_{SS}$).

The update circuit 46 according to the first circuit example includes a first switch circuit 56, a second switch circuit 58, a first AND circuit 60, an inverter circuit 62, a second AND circuit 64, a third AND circuit 66, and a fourth AND circuit 68.

The first switch circuit 56 electrically connects or disconnects between the first voltage terminal 52 and the negative power supply voltage ($V_{SS}$). The second switch circuit 58 electrically connects or disconnects the second voltage terminal 54 and the negative power supply voltage ($V_{SS}$). The first switch circuit 56 and the second switch circuit 58 are NMOS transistors each, for example.

The first AND circuit 60 outputs a first signal (A) representing the logical product of the supervisory signal and the postsynaptic spike. For example, as illustrated in A of FIG. 11, the first AND circuit 60 outputs the first signal (A) that indicates the logic-H in a case where the supervisory signal indicates the logic-H and the postsynaptic spike indicates the logic-H, and otherwise indicates the logic-L.

The inverter circuit 62 outputs an inverted supervisory signal obtained by logically inverting the supervisory signal. The second AND circuit 64 outputs a second signal (B) representing the logical product of the inverted supervisory signal and the postsynaptic spike. Specifically, as illustrated in B of FIG. 11, the second AND circuit 64 outputs the second signal (B) that indicates the logic-H in a case where the supervisory signal indicates the logic-L and the postsynaptic spike indicates the logic-H, and otherwise indicates the logic-L.

The third AND circuit 66 outputs a third signal (C) representing a logical product of the first signal (A) and the presynaptic spike. Specifically, as illustrated in C of FIG. 11, the third AND circuit 66 outputs the third signal (C) that indicates logic-H in a case where the supervisory signal indicates logic-H, the postsynaptic spike indicates logic-H, and the presynaptic spike indicates logic-H, and otherwise indicates logic-L.

The fourth AND circuit 68 outputs a fourth signal (D) representing the logical product of the second signal (B) and the presynaptic spike. Specifically, as illustrated in D of FIG. 11, the fourth AND circuit 68 outputs the fourth signal (D) that indicates logic-H in a case where the supervisory signal indicates logic-L, the postsynaptic spike indicates logic-H, and the presynaptic spike indicates logic-H, and otherwise indicates logic-L.

The first switch circuit 56 electrically connects the first voltage terminal 52 and the negative power supply voltage ($V_{SS}$) when the third signal (C) is at logic-H, and disconnects the first voltage terminal 52 and the negative power supply voltage ($V_{SS}$) when the third signal (C) is at logic-L. When the first switch circuit 56 has electrically connected between the first voltage terminal 52 and the negative power supply voltage ($V_{SS}$), the first accumulation circuit 42 emits a current of a predetermined value to the negative power supply voltage ($V_{SS}$). Accordingly, such an update circuit 46 can emit a current of a predetermined value from the first accumulation circuit 42 in a period during which the supervisory signal indicates the logic-H, the presynaptic spike indicates the logic-H, and the postsynaptic spike indicates the logic-H.

The second switch circuit 58 electrically connects between the second voltage terminal 54 and the negative power supply voltage ($V_{SS}$) when the fourth signal (D) is at logic-H, and disconnects the second voltage terminal 54 and the negative power supply voltage ($V_{SS}$) when the fourth signal (D) is at logic-L. When the second switch circuit 58 has electrically connected between the second voltage terminal 54 and the negative power supply voltage ($V_{SS}$), the second accumulation circuit 44 emits a current of a predetermined value to the negative power supply voltage ($V_{SS}$). Therefore, such an update circuit 46 can emit a current of a predetermined value from the second accumulation circuit 44 in a period during which the supervisory signal is at logic-L, the presynaptic spike is at logic-H, and the postsynaptic spike is at logic-H.

The output circuit 48 according to the first example includes a comparator 70. The comparator 70 compares the voltage of the first voltage terminal 52 with the voltage of the second voltage terminal 54, and outputs an output signal ($V_{OUT}$) indicating a comparison result. The first accumulation circuit 42 and the second accumulation circuit 44 each generate a voltage corresponding to the accumulated charge amount. The first accumulation circuit 42 and the second accumulation circuit 44 have the same characteristic. Therefore, by comparing the voltage of the first voltage terminal 52 with the voltage of the second voltage terminal 54, the output circuit 48 can output an output signal ($V_{OUT}$) indicating a difference between the charge amount accumulated in the first accumulation circuit 42 and the charge amount accumulated in the second accumulation circuit 44.

In the present example, when the voltage of the first voltage terminal 52 is equal to or less than the voltage of the second voltage terminal 54, the comparator 70 outputs a voltage of first logic (for example, logic-H) indicating that the weight is positive. In contrast, when the voltage of the second voltage terminal 54 is lower than the voltage of the first voltage terminal 52, the comparator 70 outputs a voltage at the second logic (for example, logic-L) indicating that the weight is negative.

The control circuit 50 according to the first example includes a third switch circuit 72 and a fourth switch circuit 74. The third switch circuit 72 electrically connects or disconnects between the first voltage terminal 52 and the positive power supply voltage ($V_{DD}$). The fourth switch circuit 74 electrically connects or disconnects between the second voltage terminal 54 and the positive power supply voltage ($V_{DD}$). The third switch circuit 72 and the fourth switch circuit 74 are PMOS transistors each, for example.

The third switch circuit 72 and the fourth switch circuit 74 switch states between electrical connection and disconnection in accordance with a reset signal ($V_R$). The reset signal ($V_R$) is supplied from the learning control circuit 22. With this configuration, the third switch circuit 72 and the fourth switch circuit 74 can initialize the electric charges accumulated in the first accumulation circuit 42 and the second accumulation circuit 44 under the control of the learning control circuit 22. In addition, the third switch circuit 72 and the fourth switch circuit 74 can supply a predetermined amount of electric charge to the first accumulation circuit 42 and the second accumulation circuit 44 every predetermined time or every time a predetermined event occurs in learning under the control of the learning control circuit 22.

Note that the third switch circuit 72 and the fourth switch circuit 74 may operate according to mutually different reset signals ($V_R$). With this operation, the third switch circuit 72 and the fourth switch circuit 74 can accumulate a random amount of electric charges in the first accumulation circuit 42 and the second accumulation circuit 44 respectively at the time of initialization. In this case, the control circuit 50 can put the third switch circuit 72 and the fourth switch circuit 74 in electrical connection for a random time at the time of initialization.

Figure 12:
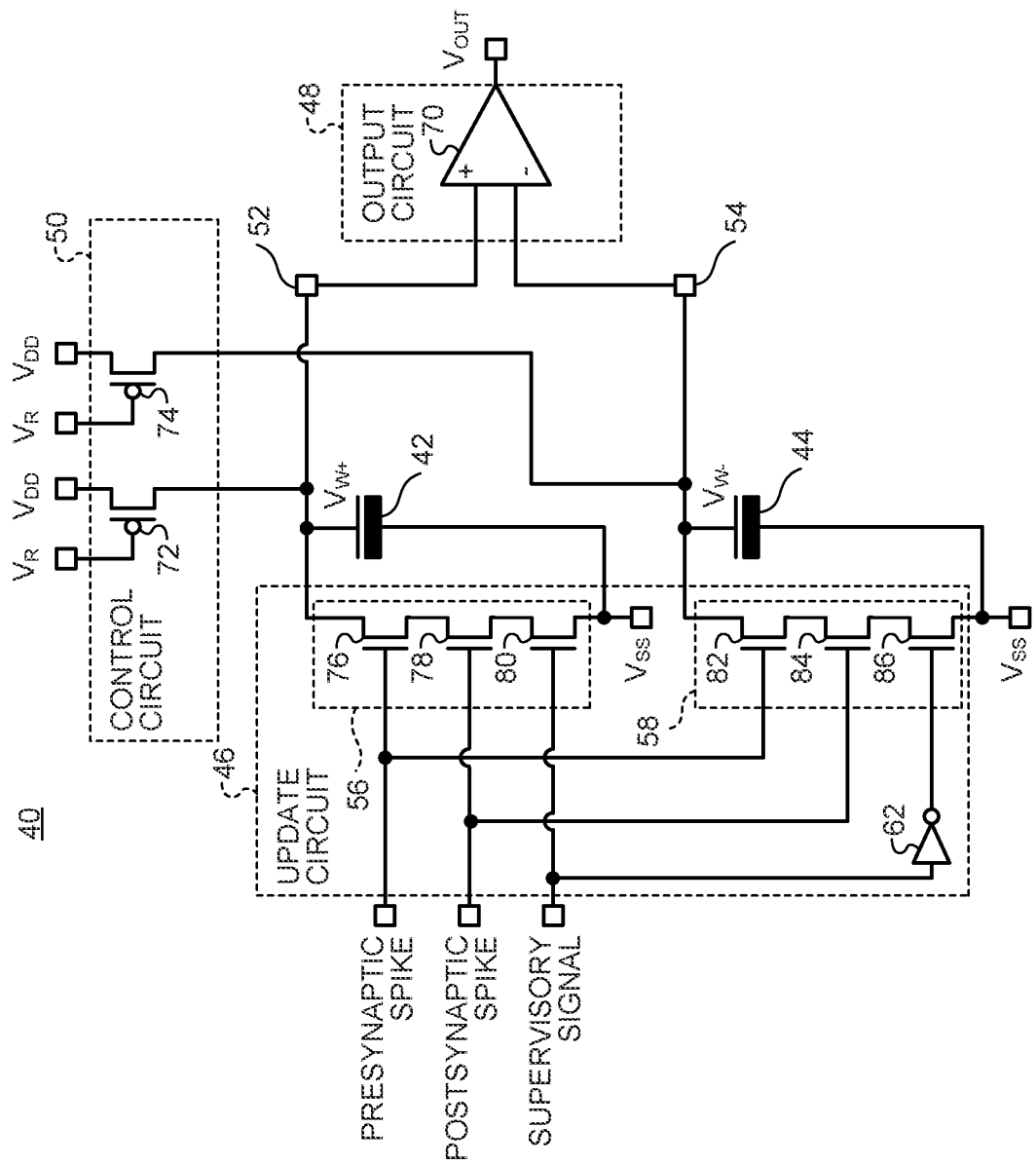
FIG. 12 is a diagram illustrating a second configuration example of the memory device on which STDP learning is performed.

FIG. 12 is a diagram illustrating a second circuit example of the memory device 40 on which STDP learning is applied. For example, the memory device 40 on which STDP learning is applied can also be implemented by the second circuit example as illustrated in FIG. 12.

The memory device 40 according to the second circuit example is different from the first circuit example in the configuration of the update circuit 46. The update circuit 46 according to the second circuit example includes a first switch circuit 56, a second switch circuit 58, and an inverter circuit 62.

The first switch circuit 56 according to the second circuit example includes a first switch element 76, a second switch element 78, and a third switch element 80. First switch element 76, second switch element 78, and third switch element 80 are connected in series between the first voltage terminal 52 and the negative power supply voltage ($V_{SS}$). The first switch element 76, second switch element 78, and third switch element 80 are each brought into either an electric connection state or electric disconnection state. The first switch element 76, the second switch element 78, and the third switch element 80 are each NMOS transistors, for example.

The first switch element 76 is in an electric connection state when the presynaptic spike is at logic-H and in an electric disconnection state when the presynaptic spike is at logic-L. The second switch element 78 is in an electric connection state when the postsynaptic spike is at logic-H and in the electric disconnection state when the postsynaptic spike is at logic-L. The third switch element 80 is in the electric connection state when the supervisory signal is at logic-H and is in the electric disconnection state when the supervisory signal is at logic-L. The first switch circuit 56 having such a configuration can electrically connect between the first voltage terminal 52 and the negative power supply voltage ($V_{SS}$) in a period during which the supervisory signal is at logic-H, the presynaptic spike is at logic-H, and the postsynaptic spike is at logic-H, and otherwise can disconnect between the first voltage terminal 52 and the negative power supply voltage ($V_{SS}$).

The inverter circuit 62 outputs an inverted supervisory signal obtained by inverting the logic of the supervisory signal.

Second switch circuit 58 according to the second circuit example includes a fourth switch element 82, a fifth switch element 84, and a sixth switch element 86. The fourth switch element 82, the fifth switch element 84, and the sixth switch element 86 are connected in series between the second voltage terminal 54 and the negative power supply voltage ($V_{SS}$). The fourth switch element 82, the fifth switch element 84, and the sixth switch element 86 are each brought into either an electric connection state or an electric disconnection state. The fourth switch element 82, the fifth switch element 84, and the sixth switch element 86 are each NMOS transistors, for example.

The fourth switch element 82 is in an electric connection state when the presynaptic spike is at logic-H and in the electric disconnection state when the presynaptic spike is at logic-L. The fifth switch element 84 is in an electric connection state when the postsynaptic spike is at logic-H and in the electric disconnection state when the postsynaptic spike is at logic-L. The sixth switch element 86 is in an electric connection state when the inverted supervisory signal is at logic-H and in the electric disconnection state when the inverted supervisory signal is at logic-L. The second switch circuit 58 having such a configuration can electrically connect between the second voltage terminal 54 and the negative power supply voltage ($V_{SS}$) in a period during which the supervisory signal is at logic-L, the presynaptic spike is at logic-H, and the postsynaptic spike is at logic-H, and otherwise can disconnect between the second voltage terminal 54 and the negative power supply voltage ($V_{SS}$).

The memory device 40 according to the second example can perform the same operation as the first example.

Figure 13:
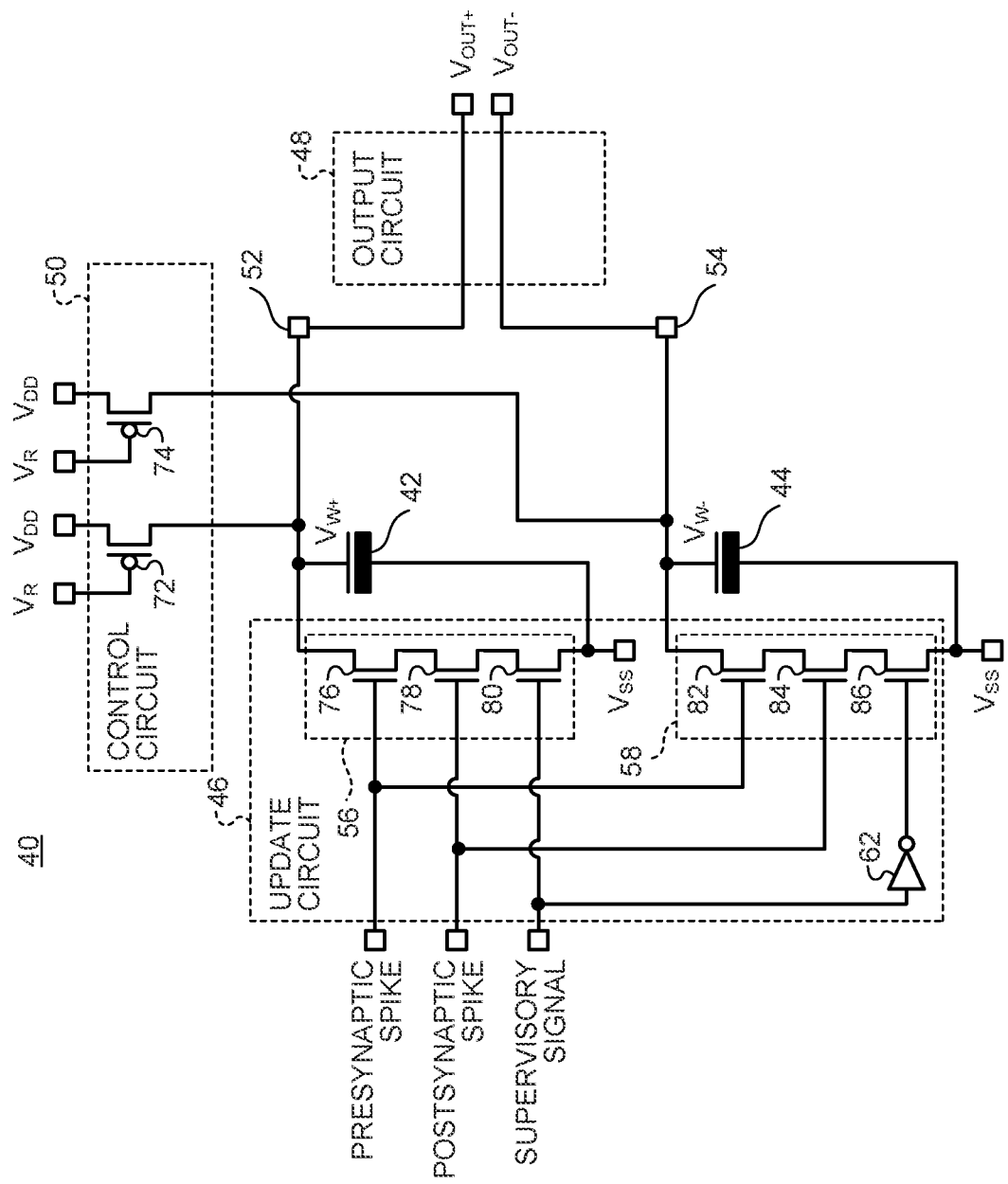
FIG. 13 is a diagram illustrating a third configuration example of the memory device on which STDP learning is applied.

FIG. 13 is a diagram illustrating a third circuit example of the memory device 40 on which STDP learning is applied. For example, the memory device 40 on which STDP learning is applied can also be implemented by the third circuit example as illustrated in FIG. 13.

The memory device 40 according to the third circuit example is different from the second circuit example in the configuration of the output circuit 48. The output circuit 48 according to the third example outputs the voltage of the first voltage terminal 52 and the voltage of the second voltage terminal 54 as original states. The output circuit 48 according to the third example may output a voltage obtained by amplifying the voltage of the first voltage terminal 52 by a predetermined factor and a voltage obtained by amplifying the voltage of the second voltage terminal 54 by a predetermined factor. Alternatively, the output circuit 48 may output a differential voltage representing a voltage difference between the voltage of the first voltage terminal 52 and the voltage of the second voltage terminal 54.

In a case where the learning weight memory circuit 20 includes the memory device 40 having such a configuration, the inference weight memory circuit 16 includes a reception circuit that converts an output signal ($V_{OUT}$) output from the memory device 40 into a binary signal. In this case, the reception circuit is a comparator, for example. The reception circuit may be a D-flip-flop circuit or an S-R latch circuit. Alternatively, the reception circuit may be a circuit having the same configuration as the SRAM cell. Note that the output circuit 48 illustrated in FIG. 13 can also be applied to the memory device 40 according to the first example illustrated in FIG. 10.

Figure 14:
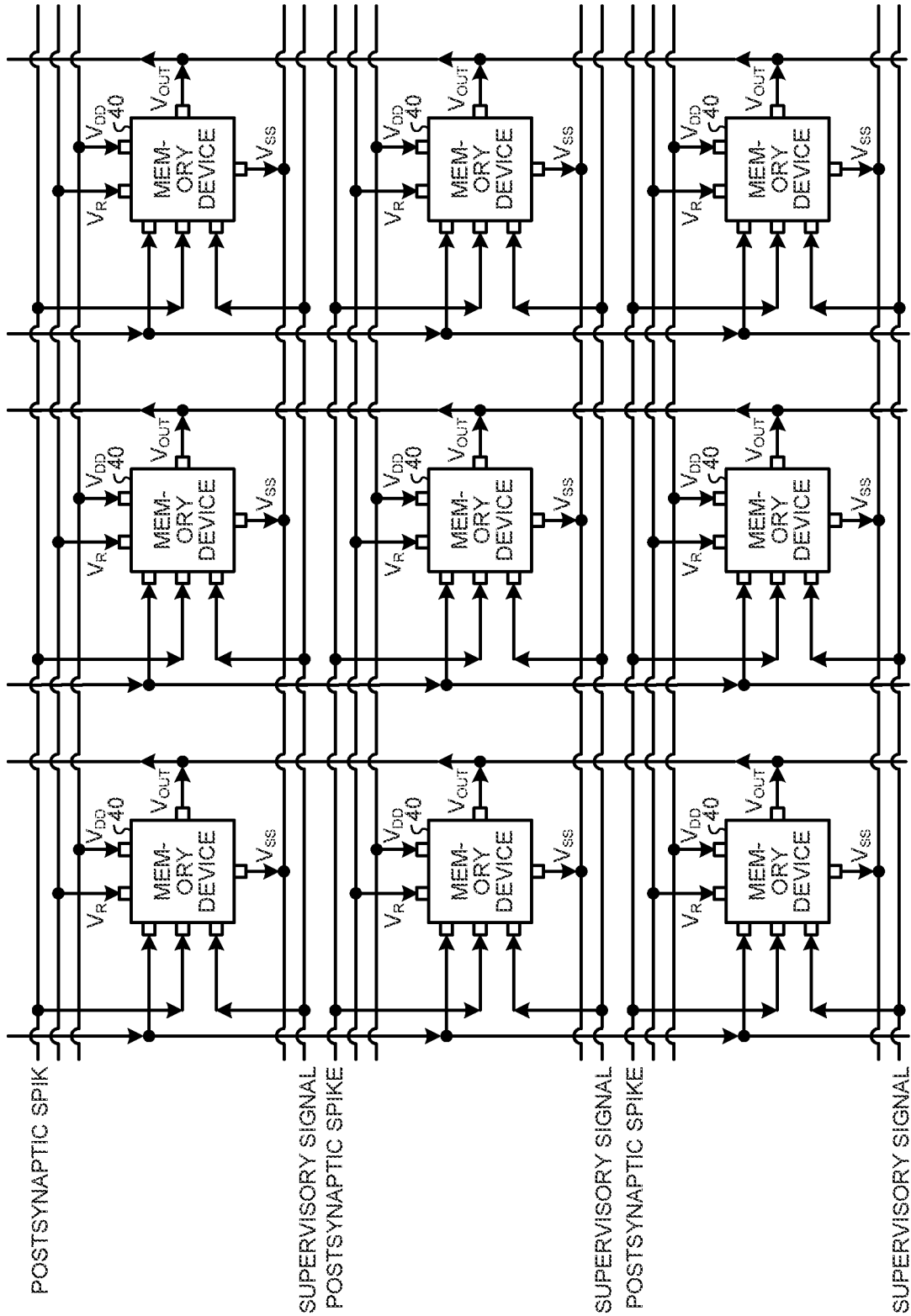
FIG. 14 is a view illustrating an example of connecting a plurality of memory devices.

FIG. 14 is a diagram illustrating an example of connecting the plurality of memory devices 40.

The learning weight memory circuit 20 includes a plurality of the memory devices 40. In a case where the weight stored in each one of the plurality of memory devices 40 is applied to STDP learning, the plurality of memory devices 40 is arranged in a matrix, for example.

In this case, the learning weight memory circuit 20 provides the first spike signal, which is either the presynaptic spike or the postsynaptic spike, to two or more memory devices 40 arranged in a row direction via a common line. In addition, the learning weight memory circuit 20 provides a second spike signal, which is the other one of the presynaptic spike or the postsynaptic spike as the first spike signal, to two or more memory devices 40 arranged in a column direction via a common line.

For example, the learning weight memory circuit 20 applies a common postsynaptic spike to two or more memory devices 40 arranged in the row direction in the matrix. Furthermore, for example, the learning weight memory circuit 20 applies a common presynaptic spike to two or more memory devices 40 arranged in the column direction in the matrix. Furthermore, for example, the learning weight memory circuit 20 applies a common supervisory signal to all of the plurality of memory devices 40 in the matrix.

The learning weight memory circuit 20 with such a configuration can cause two or more memory devices 40 arranged in the row direction to store weights assigned to two or more synaptic circuits that supply a signal to a common postsynaptic neuron. Furthermore, the learning weight memory circuit 20 can store weights assigned to two or more synaptic circuits that receive signals from a common presynaptic neuron for two or more memory devices 40 arranged in the column direction. This enables the learning weight memory circuit 20 to simplify the wiring for the plurality of memory devices 40.

In addition, the learning weight memory circuit 20 outputs, for example, output signals ($V_{OUT}$) output from two or more memory devices 40 arranged in the column direction via a common output line. In this case, a switch is provided in the output circuit 48 included in each one of the plurality of memory devices 40. The learning weight memory circuit 20 controls a switch in each of the two or more memory devices 40 included in one column to sequentially select one memory device 40 from the two or more memory devices 40 included in one column and output an output signal ($V_{OUT}$) from the common output line. This enables the learning weight memory circuit 20 to output the output signal ($V_{OUT}$) of each of the two or more memory devices 40 included in one column without interference.

Note that the learning weight memory circuit 20 may include a plurality of output lines corresponding to the plurality of memory devices 40. In this case, each one of the plurality of output lines is connected to only one memory device 40 (that is, connected to a different one of the memory device 40). With this configuration, the learning weight memory circuit 20 can output the weights stored in the plurality of memory devices 40 in parallel, enabling learning at high speed.

Figure 15:
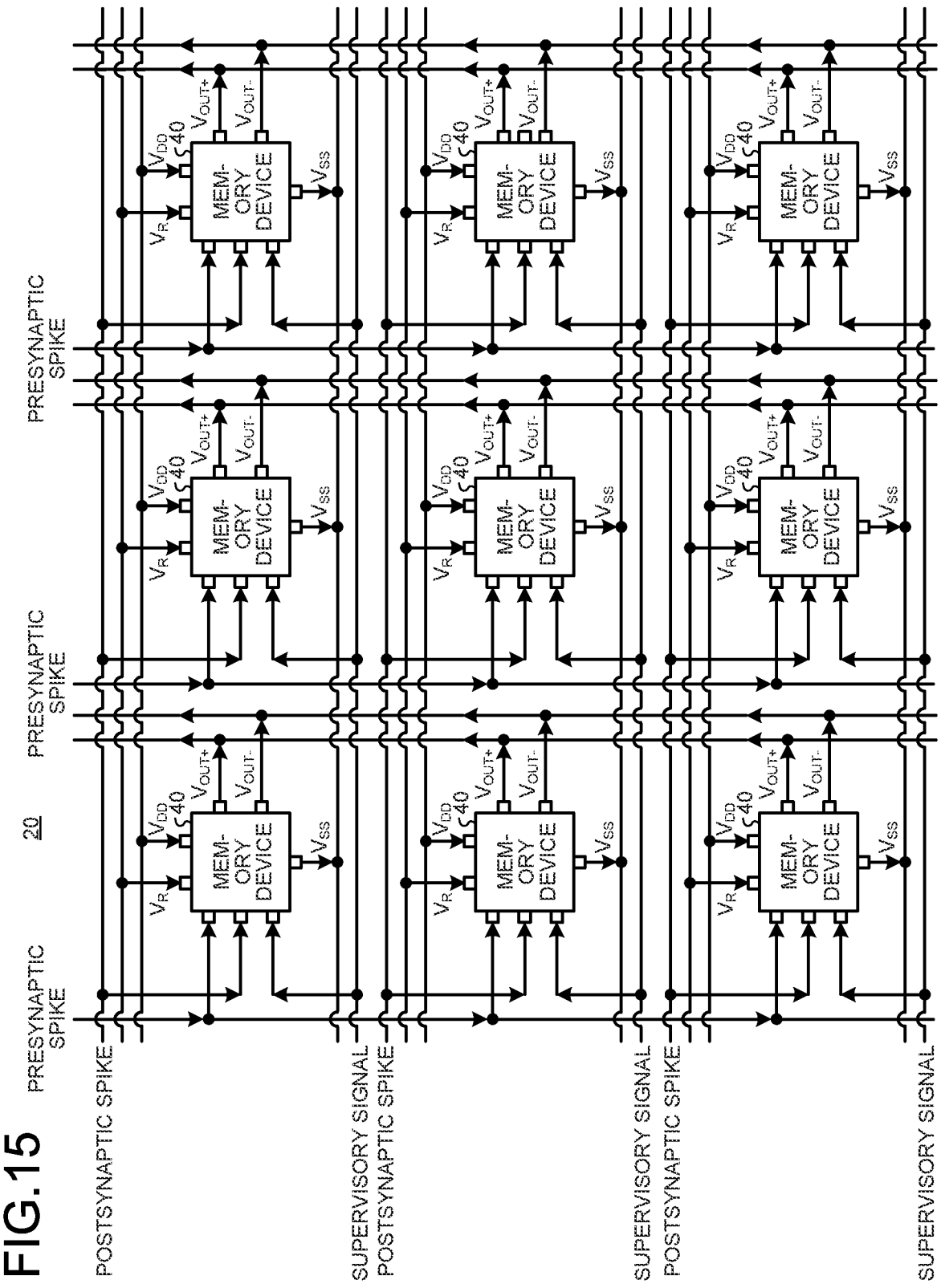
FIG. 15 is a view illustrating another example of connecting a plurality of memory devices.

FIG. 15 is a diagram illustrating another example of connecting the plurality of memory devices 40. In a case where the output circuit 48 has the configuration of outputting signals representing two voltage values as illustrated in FIG. 13, for example, the plurality of memory devices 40 is connected in the manner illustrated in FIG. 15. Specifically, the learning weight memory circuit 20 includes, for example, two common output lines corresponding to two output signals ($V_{OUT+}$ and $V_{OUT-}$) output from two or more memory devices 40 arranged in the column direction. In this case, the two common output lines are connected to the reception circuit. The reception circuit is, for example, a circuit having the same configuration as the comparator, the D-flip-flop circuit, the S-R latch circuit, or the SRAM cell.

Figure 16:
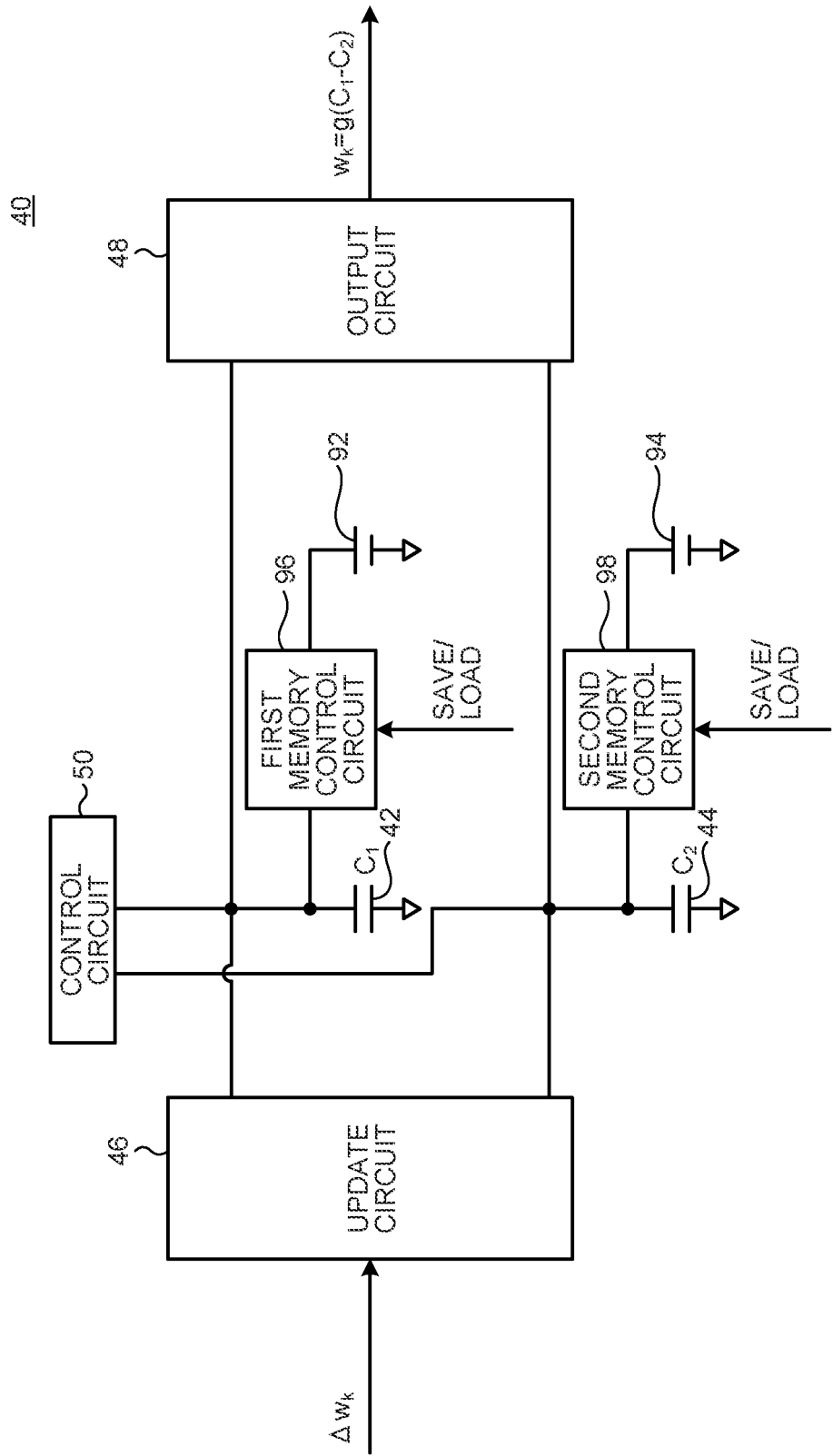
FIG. 16 is a diagram illustrating a configuration of a memory device according to a modification.

FIG. 16 is a diagram illustrating a configuration of a memory device 40 according to a modification. The memory device 40 may have a configuration according to modification as illustrated in FIG. 16.

The memory device 40 according to the modification further includes a first secondary battery 92, a second secondary battery 94, a first memory control circuit 96, and a second memory control circuit 98.

The first secondary battery 92 and the second secondary battery 94 can each store electric charges for a long period of time. Upon receiving a save instruction, the first memory control circuit 96 controls the electric charges accumulated in the first accumulation circuit 42 to be transferred to the first secondary battery 92. In addition, upon receiving a load instruction, the first memory control circuit 96 controls the electric charges accumulated in the first secondary battery 92 to be transferred to the first accumulation circuit 42.

Upon receiving a save instruction, the second memory control circuit 98 controls the electric charges accumulated in the second accumulation circuit 44 to be transferred to the second secondary battery 94. Moreover, upon receiving a load instruction, the second memory control circuit 98 controls transfer the electric charges accumulated in the second secondary battery 94 to be transferred to the second accumulation circuit 44.

For example, a capacitor has a difficulty in storing the electric charges for a long period of time due to various leakage currents in the circuit. This leads to a possibility that the first accumulation circuit 42 and the second accumulation circuit 44 lose the accumulated electric charges due to the leakage current during learning. In a case where the electric charges accumulated in the first accumulation circuit 42 and the second accumulation circuit 44 are lost before the learning is completed in this manner, it may be difficult for the memory device 40 to execute learning of the weight with high precision.

Considering the above possibility, the memory device 40 according to the modification is able to perform a charge transfer process in a case where, for example, a predetermined time of time has elapsed during learning, or the weight once learned is desired to be used again after a predetermined time of time. Specifically, the memory device 40 according to the modification can transfer the electric charges accumulated in the first accumulation circuit 42 and the second accumulation circuit 44 to the first secondary battery 92 and the second secondary battery 94, and can thereafter return the electric charges stored in the first secondary battery 92 and the second secondary battery 94 to the first accumulation circuit 42 and the second accumulation circuit 44, respectively.

Configuration Example of Product-Sum Operation Circuit 30

Figure 17:
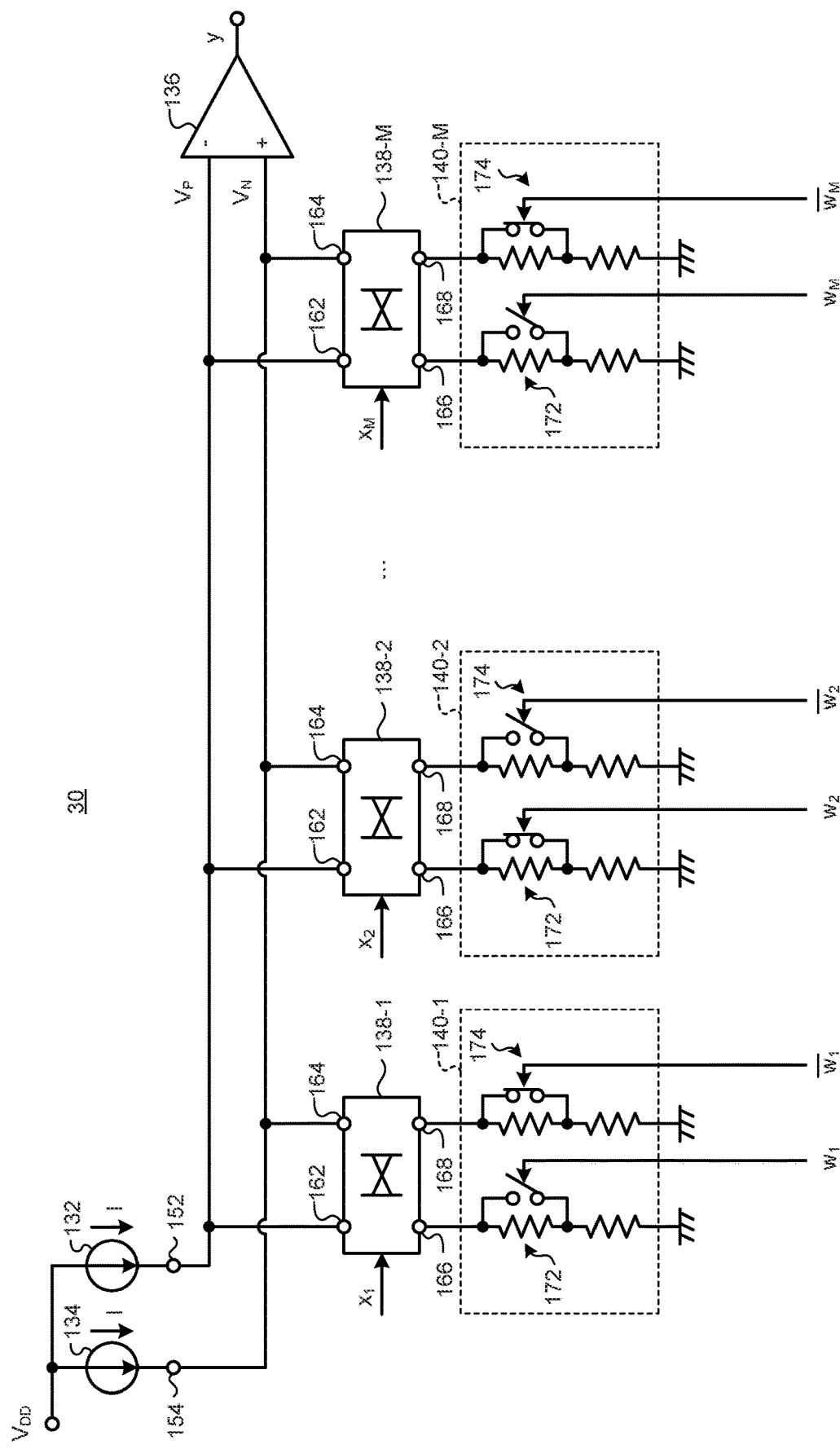
FIG. 17 is a hardware configuration diagram of product-sum operation circuit.

FIG. 17 is a diagram illustrating a hardware configuration of the product-sum operation circuit 30. The product-sum operation circuit 30 includes a positive-side current source 132, a negative-side current source 134, a comparison unit 136, M cross switches 138, and M cells 140.

The positive-side current source 132 is provided between the positive power supply voltage ($V_{DD}$) and a positive terminal 152. The positive-side current source 132 outputs a current having a preset current value (I) from the positive terminal 152. The positive-side current source 132 may include, for example, a current mirror circuit. Furthermore, the positive-side current source 132 may have a configuration in which a plurality of current source circuits is connected in parallel.

The negative-side current source 134 is provided between the positive power supply voltage ($V_{DD}$) and a negative terminal 154. The negative-side current source 134 outputs a current of a preset current value (I) from the negative terminal 154. The negative-side current source 134 outputs a current having the same value as the current output from the positive-side current source 132. The negative-side current source 134 may include, for example, a current mirror circuit. In addition, the negative-side current source 134 may have a configuration in which a plurality of current source circuits is connected in parallel.

The comparison unit 136 is a comparator circuit, for example. The comparison unit 136 compares magnitudes of a positive terminal voltage $V_P$ which is a voltage of the positive terminal 152 and a negative terminal voltage $V_N$ which is a voltage of the negative terminal 154. Thereafter, the comparison unit 136 outputs an intermediate signal (y) having a value corresponding to the comparison result between the positive terminal voltage $V_P$ and the negative terminal voltage $V_N$. The comparison unit 136 outputs an intermediate signal of first logic (for example, −1) when the positive terminal voltage $V_P$ is lower than the negative terminal voltage $V_N$, and outputs an intermediate signal of second logic (for example, +1) when the positive terminal voltage $V_P$ is equal to or more than the negative terminal voltage $V_N$. Note that the comparison unit 136 may output an intermediate signal of the second logic (for example, +1) in a case where the positive terminal voltage $V_P$ is lower than the negative terminal voltage $V_N$, and may output an intermediate signal of the first logic (for example, −1) in a case where the positive terminal voltage $V_P$ is equal to or more than the negative terminal voltage $V_N$.

The M cross switches 138 are provided to correspond one-to-one to M input signals. In the present embodiment, the product-sum operation circuit 30 includes a first cross switch 138-1 to an M-th cross switch 138-M as the M cross switches 138. For example, the first cross switch 138-1 corresponds to the first input signal ($x_1$), the second cross switch 138-2 corresponds to the second input signal ($x_2$), and the M-th cross switch 138-M corresponds to the M-th input signal ($x_M$).

Each of the M cross switches 138 has a positive inflow terminal 162, a negative inflow terminal 164, a first terminal 166, and a second terminal 168.

Each of the M cross switches 138 connects the first terminal 166 to either the positive inflow terminal 162 or the negative inflow terminal 164. Furthermore, each of the M cross switches 138 connects the second terminal 168 to the other one of the positive inflow terminal 162 and the negative inflow terminal 164, to which the first terminal 166 is not connected. Each of the M cross switches 138 switches connections between the first/second terminals 166, 168 and the positive/negative inflow terminals 162, 164, based on the value of the corresponding input signal.

The M cells 140 are provided in one-to-one correspondence with the M weights. In the present embodiment, the product-sum operation circuit 30 includes a first cell 140-1 to an M-th cell 140-M as the M cells 140. For example, the first cell 140-1 corresponds to the first weight ($w_1$), the second cell 140-2 corresponds to the second weight ($w_2$), and the M-th cell 140-M corresponds to the M-th weight ($w_M$). The first weight ($w_1$) corresponds to the first input signal ($x_1$), the second weight ($w_2$) corresponds to the second input signal ($x_2$), and the M-th weight ($w_M$) corresponds to the M-th input signal ($x_M$). Accordingly, for example, the first cell 140-1 corresponds to the first cross switch 138-1, the second cell 140-2 corresponds to the second cross switch 138-2, and the M-th cell 140-M corresponds to the M-th cross switch 138-M.

Each of the M cells 140 includes a first variable resistor 172 and a second variable resistor 174. The first variable resistor 172 is connected at one end to the first terminal 166 of the corresponding cross switch 138 while being connected at the other end to a first reference potential. The first reference potential is, for example, ground. The second variable resistor 174 is connected at one end to the second terminal 168 of the corresponding cross switch 138 while being connected at the other end to the first reference potential.

The magnitude relationship of the resistance values of the first variable resistor 172 and the second variable resistor 174 is switched depending on the corresponding weights. For example, the inference weight memory circuit 16 receives M weights prior to receiving M input signals. Then, the inference weight memory circuit 16 sets the magnitude relationship between the resistance values of the first variable resistor 172 and the second variable resistor 174 included in the corresponding cell 140 in accordance with each of the received M weights.

For example, in each one of the plurality of cells 140, when the corresponding weight is +1, the first variable resistor 172 is set to a first resistance value ($R_1$), and the second variable resistor 174 is set to a second resistance value ($R_2$) different from the first resistance value. Furthermore, in each one of the plurality of cells 140, when the corresponding weight is −1, the first variable resistor 172 is set to the second resistance value ($R_2$), and the second variable resistor 174 is set to the first resistance value ($R_1$).

In addition, each of the M cross switches 138 switches between the straight connection and the reverse connection with respect to connections between the first/second terminals 166, 168 and the positive/negative terminals 152, 154 (or the positive/negative inflow terminals 162, 164) in accordance with the corresponding input signal values.

For example, when the straight connection is applied, each of the M cross switches 138 connects the first terminal 166 and the positive terminal 152 (positive inflow terminal 162) and connects the second terminal 168 and the negative terminal 154 (negative inflow terminal 164). When the reverse connection is applied, each of the M cross switches 138 connects the first terminal 166 and the negative terminal 154 (negative inflow terminal 164) and connects the second terminal 168 and the positive terminal 152 (positive inflow terminal 162).

For example, each of the M cross switches 138 applies the straight connection to the terminals when the corresponding input signal value is +1 and applies the reverse connection to the terminals when the corresponding input signal value is −1. On the other hand, each of the M cross switches 138 may use the reverse connection when the corresponding input signal value is +1 and may use the straight connection when the corresponding input signal value is −1.

Figure 18:
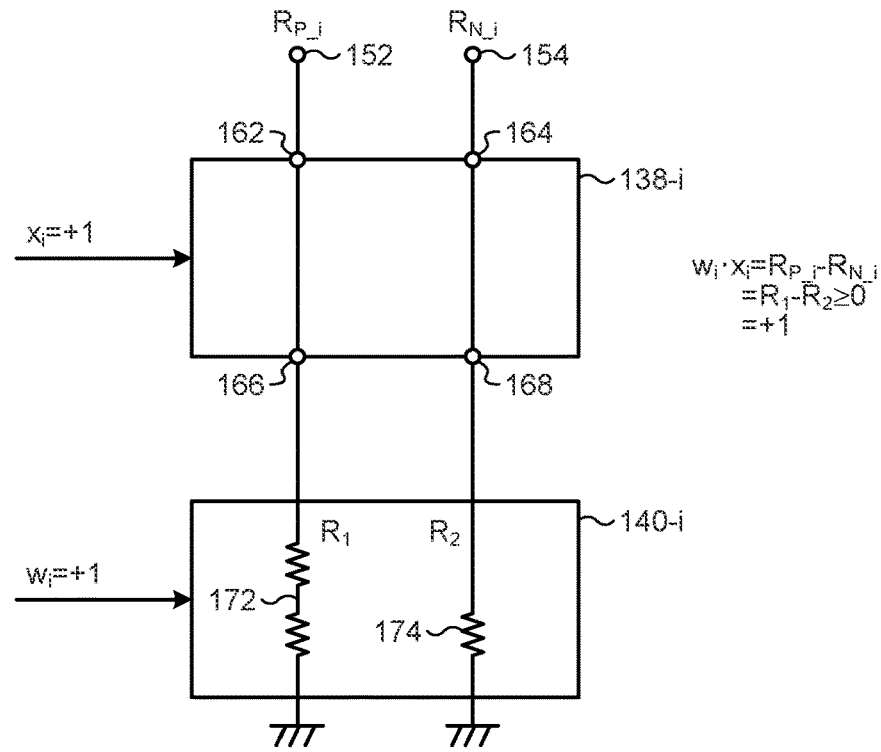
FIG. 18 is an illustration of an arithmetic operation when $x_i=+1$ and $w_i=+1$.

FIG. 18 is a diagram illustrating arithmetic operation of the product-sum operation circuit 30 when $w_i=+1$ and $x_i=+1$. When the i-th weight value ($w_i$) is +1, the first variable resistor 172 of the i-th cell 140-$i$ is set to the first resistance value ($R_1$). When the i-th weight value ($w_i$) is +1, the second variable resistor 174 of the i-th cell 140-$i$ is set to the second resistance value ($R_2$). Note that $R_1 > R_2$.

Furthermore, when the i-th input signal ($x_i$) is +1, the i-th cross switch 138-$i$ applies the straight connection to the terminals. Therefore, the positive terminal 152 of the positive-side current source 132 supplies current to the first variable resistor 172 of the i-th cell 140-$i$. Furthermore, the negative terminal 154 of the negative-side current source 134 supplies current to the second variable resistor 174 of the i-cell 140-$i$.

Here, the product-sum operation circuit 30 represents a calculation result of a value ($w_i \cdot x_i$) obtained by multiplying the i-th weight ($w_i$) by the i-th input signal ($x_i$) by using a resistance difference ($R_{P\_i} - R_{N\_i}$) between the resistance value ($R_{P\_i}$) when viewing the i-th cell 140-$i$ from the positive terminal 152 and the resistance value ($R_{N\_i}$) when viewing the i-th cell 140-$i$ from the negative terminal 154.

Therefore, in the example of FIG. 18, $R_{P\_i}=R_1$ and $R_{N\_i}=R_2$ are established, and the resistance difference ($R_{P\_i} - R_{N\_i}$) becomes a positive value. Therefore, when $w_i=+1$ and $x_i=+1$, the product-sum operation circuit 30 can calculate +1 as the value ($w_i \cdot x_i$) obtained by multiplying the i-th weight ($w_i$) and the i-th input signal ($x_i$).

Figure 19:
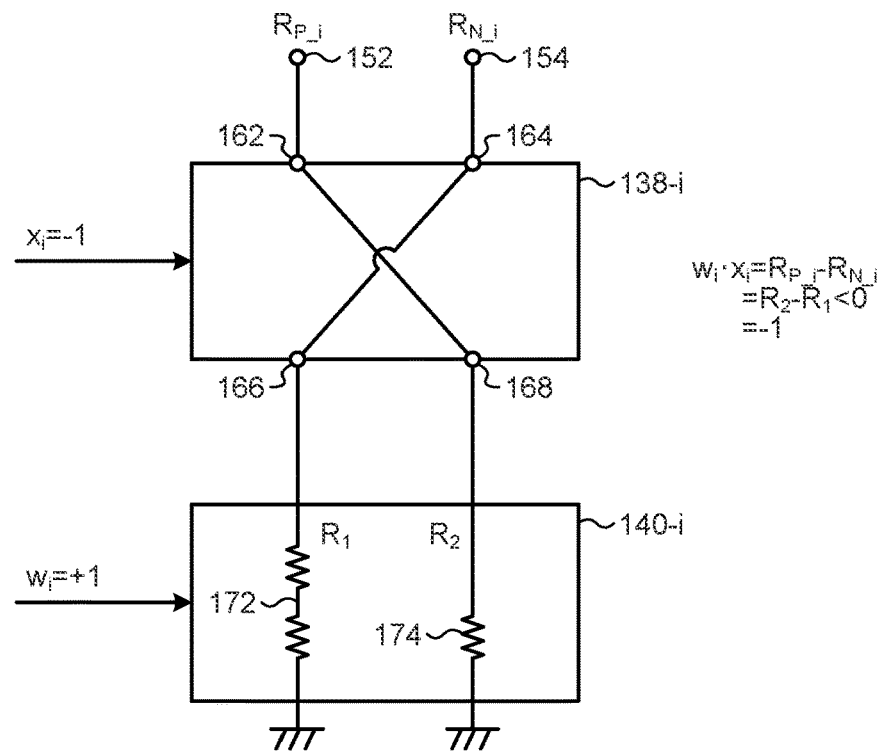
FIG. 19 is an illustration of a arithmetic operation when $x_i=-1$ and $w_i=+1$.

FIG. 19 is a diagram illustrating arithmetic operation of the product-sum operation circuit 30 when $w_i=+1$ and $x_i=-1$. When the i-th weight value ($w_i$) is +1, the first variable resistor 172 of the i-th cell 140-$i$ is set to the first resistance value ($R_1$). When the i-th weight value ($w_i$) is +1, the second variable resistor 174 of the i-th cell 140-$i$ is set to the second resistance value ($R_2$).

When the i-th input signal ($x_i$) is −1, the i-th cross switch 138-$i$ applies the reverse connection to the terminals. Therefore, the positive terminal 152 of the positive-side current source 132 supplies current to the second variable resistor 174 of the i-th cell 140-$i$. Furthermore, the negative terminal 154 of the negative-side current source 134 supplies current to the first variable resistor 172 of the i-cell 140-$i$.

Therefore, in the example of FIG. 19, $R_{P\_i}=R_2$ and $R_{N\_i}=R_1$ are established, and the resistance difference ($R_{P\_i} - R_{N\_i}$) is a negative value. Therefore, when $w_i=+1$ and $x_i=-1$, the product-sum operation circuit 30 can calculate −1 as the value ($w_i \cdot x_i$) obtained by multiplying the i-th weight ($w_i$) and the i-th input signal ($x_i$).

Figure 20:
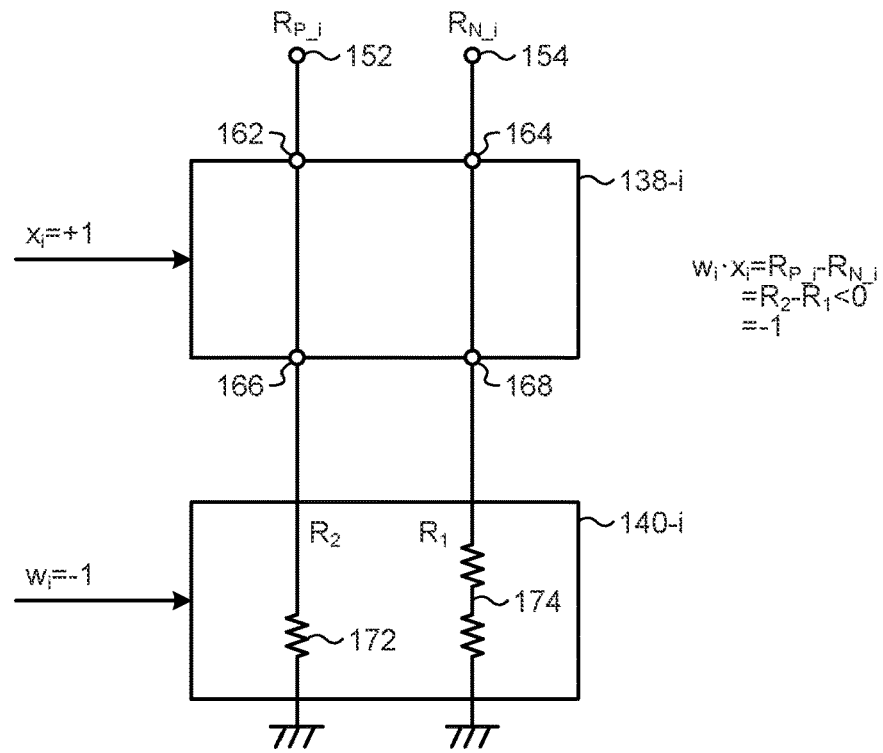
FIG. 20 is an illustration of an arithmetic operation when $x_i=+1$ and $w_i=-1$.

FIG. 20 is a diagram illustrating arithmetic operation of the product-sum operation circuit 30 when $w_i=-1$ and $x_i=+1$. When the i-th weight ($w_i$) is −1, the first variable resistor 172 of the i-th cell 140-$i$ is set to the second resistance value ($R_2$). When the i-th weight value ($w_i$) is −1, the second variable resistor 174 of the i-th cell 140-$i$ is set to the first resistance value ($R_1$).

Furthermore, when the i-th input signal ($x_i$) is +1, the i-th cross switch 138-$i$ applies the straight connection to the terminals. Therefore, the positive terminal 152 of the positive-side current source 132 supplies current to the first variable resistor 172 of the i-th cell 140-$i$. Furthermore, the negative terminal 154 of the negative-side current source 134 supplies current to the second variable resistor 174 of the i-cell 140-$i$.

Therefore, in the example of FIG. 20, $R_{P\_i}=R_2$ and $R_{N\_i}=R_1$ are established, and the resistance difference ($R_{P\_i} - R_{N\_i}$) is a negative value. Therefore, when $w_i=-1$ and $x_i=+1$, the product-sum operation circuit 30 can calculate −1 as the value ($w_i \cdot x_i$) obtained by multiplying the i-th weight ($w_i$) and the i-th input signal ($x_i$).

Figure 21:
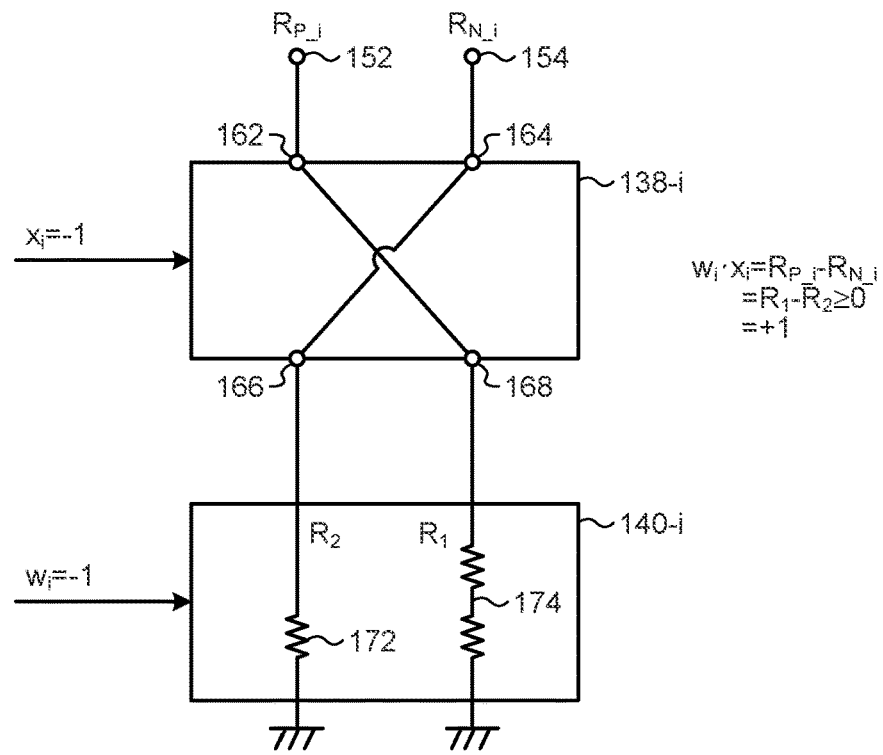
FIG. 21 is an illustration of an arithmetic operation when $x_i=-1$ and $w_i=-1$.

FIG. 21 is a diagram illustrating arithmetic operation of the product-sum operation circuit 30 when $w_i=-1$ and $x_i=-1$. When the i-th weight ($w_i$) is −1, the first variable resistor 172 of the i-th cell 140-$i$ is set to the second resistance value ($R_2$). When the i-th weight value ($w_i$) is −1, the second variable resistor 174 of the i-th cell 140-$i$ is set to the first resistance value ($R_1$).

When the i-th input signal ($x_i$) is −1, the i-th cross switch 138-$i$ applies the reverse connection to the terminals. Therefore, the positive terminal 152 of the positive-side current source 132 supplies current to the second variable resistor 174 of the i-th cell 140-$i$. Furthermore, the negative terminal 154 of the negative-side current source 134 supplies current to the first variable resistor 172 of the i-cell 140-$i$.

Therefore, in the example of FIG. 21, $R_{P\_i}=R_1$ and $R_{N\_i}=R_2$ are established, and the resistance difference ($R_{P\_i} - R_{N\_i}$) is a positive value. Therefore, when $w_i=-1$ and $x_i=-1$, the product-sum operation circuit 30 can calculate +1 as the value $(w_i \cdot x_i)$ obtained by multiplying the i-th weight $(w_i)$ and the i-th input signal $(x_i)$.

As described above, the difference $(R_{P\_i} - R_{N\_i})$ between the resistance value $(R_{P\_i})$ viewing the i-th cell 140-i from the positive terminal 152 and the resistance value $(R_{N\_i})$ viewing the i-th cell 140-i from the negative terminal 154 represents the multiplication value $(w_i \cdot x_i)$ of the i-th weight $(w_i)$ and the i-th input signal $(x_i)$. Therefore, a difference value $\{R_P - R_N\}$ between a combined resistance value $R_P$ connected to the positive terminal 152 of the positive-side current source 132 and a combined resistance value $R_N$ connected to the negative terminal 154 of the negative-side current source 134 represents a product-sum operation (multiply-accumulation) result of M input signals and M weights.

Figure 22:
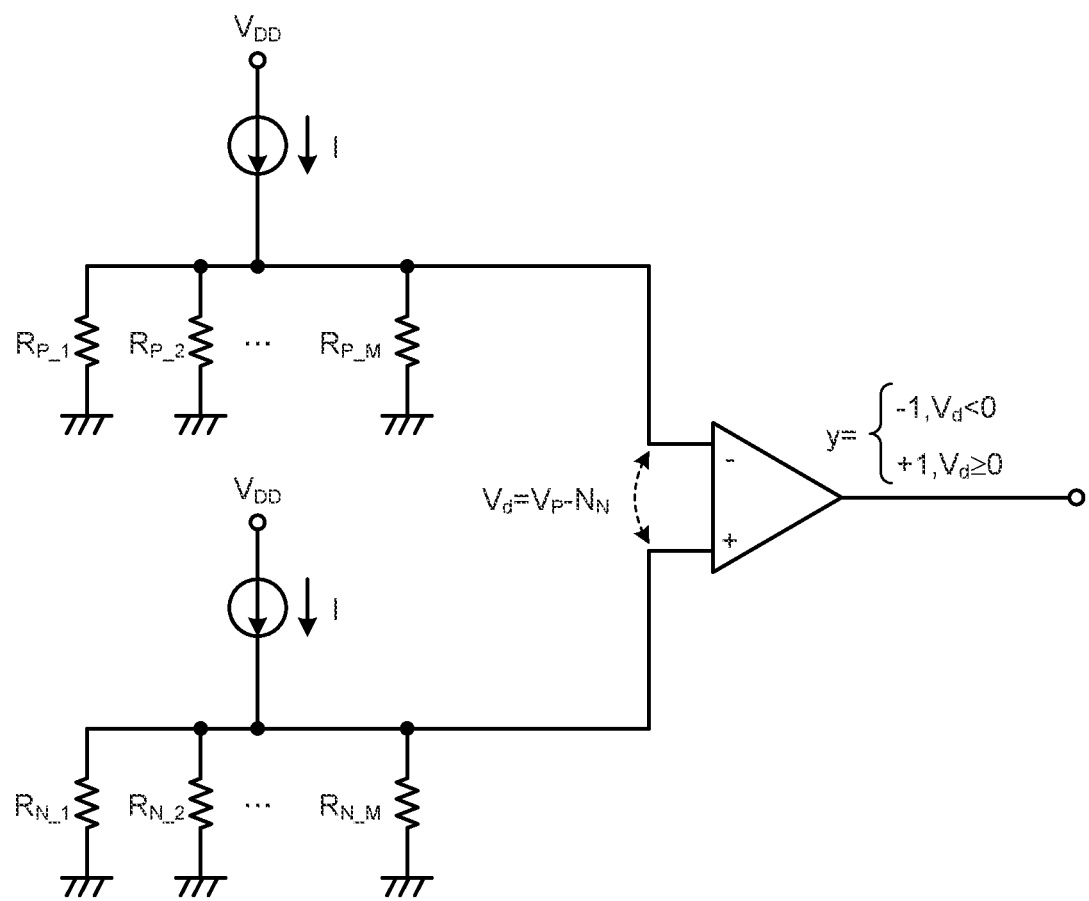
FIG. 22 is an illustration of operation of a comparator.

FIG. 22 is a diagram illustrating operations of the positive-side current source 132, the negative-side current source 134, and the comparison unit 136.

The positive-side current source 132 outputs a current to the first cell 140-1 of $R_{P\_1}$. Furthermore, the positive-side current source 132 outputs a current to the second cell 140-2 of $R_{P\_2}$. Furthermore, the positive-side current source 132 outputs a current to the M-th cell 140-M of $R_{P\_M}$. That is, the positive-side current source 132 outputs a predetermined value current (I) to the resistor of the combined resistance value $[R_P = 1/\{(1/R_{P\_1}) + (1/R_{P\_2}) + \ldots + (1/R_{P\_M})\}]$. Therefore, a positive terminal voltage $V_P$ obtained by multiplying the current I of the predetermined value by the combined resistance value $R_P$ is generated in the positive terminal 152.

The negative-side current source 134 outputs the current to the first cell 140-1 of $R_{N\_1}$. Furthermore, the negative-side current source 134 outputs the current to the second cell 140-2 of $R_{N\_2}$. In addition, the negative-side current source 134 outputs the current to the M-th cell 140-M of $R_{N\_M}$. Therefore, the negative-side current source 134 outputs the predetermined value current (I) from the negative terminal 154 to the resistor of the combined resistance value $[R_N = 1/\{(1/R_{N\_1}) + (1/R_{N\_2}) + \ldots + (1/R_{N\_M})\}]$. Consequently, a negative terminal voltage $V_N$ obtained by multiplying the current I of the predetermined value by the combined resistance value $R_N$ is generated in the negative terminal 154.

The comparison unit 136 outputs an intermediate signal (y) indicating a determination result as to whether a difference (Vd) between the positive terminal voltage $V_P$ and the negative terminal voltage $V_N$ is smaller than 0, or 0 or more. For example, the comparison unit 136 outputs the intermediate signal (y) of the first logic (for example, −1) when the difference (Vd) between the positive terminal voltage $V_P$ and the negative terminal voltage $V_N$ is smaller than 0, and outputs the intermediate signal (y) of the second logic (for example, +1) when the difference (Vd) is 0 or more.

Here, a difference value $\{R_P - R_N\}$ between the combined resistance value $R_P$ of the resistor connected to the positive terminal 152 of the positive-side current source 132 and the combined resistance value $R_N$ of the resistor connected to the negative terminal 154 of the negative-side current source 134 represents a product-sum operation (multiply-accumulation) result of M input signals and M weights. The difference (Vd) between the positive terminal voltage $V_P$ and the negative terminal voltage $V_N$ is proportional to the difference between $R_P$ and $R_N$. Accordingly, the intermediate signal (y) output from the comparison unit 136 represents whether the product-sum operation (multiply-accumulation) value of M input signals and M weights is less than 0, or 0 or more.

In this manner, the product-sum operation circuit 30 can execute the product-sum operation (multiply-accumulation) with M weights by analog processing. Consequently, the product-sum operation circuit 30 can output an intermediate signal (y) obtained by binarizing the product-sum operation value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device storing weights used for arithmetic operation of a neural network, the memory device comprising:
   a first accumulation circuit configured to accumulate electric charges;
   a second accumulation circuit configured to accumulate electric charges;
   an update circuit configured to change, in accordance with an update amount for updating the weight, a difference between a charge amount accumulated in the first accumulation circuit and a charge amount accumulated in the second accumulation circuit; and
   an output circuit configured to output, as an output signal representing the weight, a signal corresponding to the difference between the charge amount accumulated in the first accumulation circuit and the charge amount accumulated in the second accumulation circuit,
   wherein the update circuit performs the change of the difference by
      changing, when the update amount is positive, the electric charges accumulated in the first accumulation circuit in a first direction by a charge amount corresponding to an absolute value of the update amount, the first direction being either an increasing direction or a decreasing direction, and
      changing, when the update amount is negative, the electric charges accumulated in the second accumulation circuit in the first direction by a charge amount corresponding to an absolute value of the update amount.

2. The memory device according to claim 1, wherein the first accumulation circuit and the second accumulation circuit are capacitors each having a same characteristic.

3. The memory device according to claim 1, wherein the first accumulation circuit and the second accumulation circuit are secondary batteries each having a same characteristic.

4. The memory device according to claim 1, wherein the update circuit
   supplies a preset current to either the first accumulation circuit or the second accumulation circuit for a time corresponding to an absolute value of the update amount, or
   causes either the first accumulation circuit or the second accumulation circuit to emit a preset current.

5. The memory device according to claim 1, wherein the update circuit
   supplies, by using a transfer capacitor having a preset capacitance, a charge as many times as the absolute value of the update amount to either the first accumulation circuit or the second accumulation circuit, or causes either the first accumulation circuit or the second accumulation circuit to emit a charge as many times as the absolute value of the update amount by using the transfer capacitor.

6. The memory device according to claim 1, further comprising a control circuit configured to, at a time of initialization, control the first accumulation circuit and the second accumulation circuit to each accumulate a preset amount or a random amount of electric charges.

7. The memory device according to claim 6, wherein, in a learning period, the control circuit controls the electric charge accumulated in the first accumulation circuit and the electric charge accumulated in the second accumulation circuit to each change in a second direction different from the first direction among an increasing direction and a decreasing direction.

8. The memory device according to claim 6, wherein the update circuit includes
- a first switch circuit configured to electrically connect or disconnect between one of terminals of the first accumulation circuit and a first potential, and
- a second switch circuit configured to electrically connect or disconnect between one of terminals of the second accumulation circuit and the first potential, and the update circuit is further configured to
- cause, when the update amount is positive, the first switch circuit to perform the electric connection for a time corresponding to an absolute value of the update amount and the second switch circuit to perform the electric disconnection, and
- cause, when the update amount is negative, the second switch circuit to perform the electric connection for a time corresponding to an absolute value of the update amount and the first switch circuit to perform the electric disconnection.

9. The memory device according to claim 5, wherein the control circuit includes
- a third switch circuit configured to electrically connect or disconnect between one of terminals of the first accumulation circuit and a second potential different from the first potential, and
- a fourth switch circuit configured to electrically connect or disconnect between one of terminals of the second accumulation circuit and the second potential, and the control circuit is further configured to control, at the time of initialization, the third switch circuit and the fourth switch circuit to each perform the electric connection for a preset time or a random time.

10. The memory device according to claim 1, wherein the output circuit outputs an output signal corresponding to a potential difference between a voltage of the first accumulation circuit and a voltage of the second accumulation circuit.

11. The memory device according to claim 1, further comprising:
- a first secondary battery;
- a second secondary battery;
- a first memory control circuit; and
- a second memory control circuit, wherein
the first accumulation circuit and the second accumulation circuit are capacitors each having a same characteristic, the first memory control circuit is configured to
- control the electric charge accumulated in the first accumulation circuit to be transferred to the first secondary battery upon receiving a save instruction, and
- control the electric charge accumulated in the first secondary battery to be transferred to the first accumulation circuit upon receiving a load instruction, and the second memory control circuit is configured to
- control the electric charge accumulated in the second accumulation circuit to be transferred to the second secondary battery upon receiving the save instruction, and
- control the electric charge accumulated in the second secondary battery to be transferred to the second accumulation circuit upon receiving the load instruction.

12. A memory device storing weights set for a synaptic circuit in a neuromorphic processor using a neural network, the memory device comprising:
- a first accumulation circuit configured to accumulate an electric charge;
- a second accumulation circuit configured to accumulate an electric charge;
- an update circuit configured to change a difference between a charge amount accumulated in the first accumulation circuit and a charge amount accumulated in the second accumulation circuit; and
- an output circuit configured to output, as an output signal representing the weight, a signal corresponding to the difference between the charge amount accumulated in the first accumulation circuit and the charge amount accumulated in the second accumulation circuit, wherein the update circuit performs the change of the difference by
- receiving a presynaptic spike, a postsynaptic spike, and a supervisory signal, in spike timing dependent synaptic plasticity learning;
- applying, in a first direction, a predetermined current to the first accumulation circuit in a period during which the supervisory signal indicates first logic, the presynaptic spike indicates the first logic, and the postsynaptic spike indicates the first logic, the first direction being either an increasing direction or a decreasing direction, and
- applying a current of a predetermined value to the second accumulation circuit in a period during which the supervisory signal indicates second logic, the presynaptic spike indicates the first logic, and the postsynaptic spike indicates the first logic, the supervisory signal is a binary signal indicating that an input signal is being given to the neural network, the presynaptic spike is a signal indicating that a presynaptic neuron connected to a previous stage of the synaptic circuit has fired, and the postsynaptic spike is a signal indicating that a postsynaptic neuron connected to a subsequent stage of the synaptic circuit has fired.

13. The memory device according to claim 12, wherein
the first accumulation circuit emits a current of a predetermined value in the period during which the supervisory signal indicates the first logic, the presynaptic spike indicates the first logic, and the postsynaptic spike indicates the first logic, and the second accumulation circuit emits a current of a predetermined value in the period during which the supervisory signal indicates the second logic, the presynaptic spike indicates the first logic, and the postsynaptic spike indicates the first logic.

14. The memory device according to claim 12, wherein
the first accumulation circuit is supplied with a current of a predetermined value in the period during which the supervisory signal indicates the first logic, the presynaptic spike indicates the first logic, and the postsynaptic spike indicates the first logic, and the second accumulation circuit is supplied with a current of a predetermined value in the period during which the supervisory signal indicates the second logic, the presynaptic spike indicates the first logic, and the postsynaptic spike indicates the first logic.

15. A neural network apparatus comprising:
an arithmetic circuit configured to execute arithmetic processing according to a neural network;
an inference weight memory circuit configured to store a plurality of inference weights used in the arithmetic processing to be executed by the arithmetic circuit;
a learning weight memory circuit configured to store a plurality of weights corresponding to the plurality of inference weights in a learning process of the neural network; and
a learning control circuit configured to, in the learning process,
control the learning weight memory circuit to update the plurality of weights stored in the learning weight memory circuit, based on a result of operation of the arithmetic circuit, and,
after the learning process, control the learning weight memory circuit to store a plurality of values corresponding to the plurality of weights stored in the learning weight memory circuit, as the plurality of inference weights in the inference weight memory circuit, wherein
the learning weight memory circuit includes a plurality of memory devices corresponding to a plurality of weights,
each one of the plurality of weights corresponds to a different one of the plurality of memory devices,
each one of the plurality of memory devices includes
a first accumulation circuit configured to accumulate electric charges,
a second accumulation circuit configured to accumulate electric charges,
an update circuit configured to change, in accordance with an update amount for updating a corresponding weight among the plurality of weights, a difference between a charge amount accumulated in the first accumulation circuit and a charge amount accumulated in the second accumulation circuit, and
an output circuit configured to output, as an output signal representing the corresponding weight, a signal corresponding to a difference between the charge amount accumulated in the first accumulation circuit and the charge amount accumulated in the second accumulation circuit, and
the update circuit performs the change of the difference by
changing, when the update amount is positive, the electric charges accumulated in the first accumulation circuit in a first direction by a charge amount corresponding to an absolute value of the update amount, the first direction being either an increasing direction or a decreasing direction, and
changing, when the update amount is negative, the electric charges accumulated in the second accumulation circuit in the first direction by a charge amount corresponding to an absolute value of the update amount.

16. The neural network apparatus according to claim 15, wherein
the plurality of memory devices is arranged in a matrix,
two or more memory devices arranged in a row direction in the plurality of memory devices are supplied with, via a common line, a first spike signal that is either a presynaptic spike or a postsynaptic spike in spike timing dependent synaptic plasticity learning, and
two or more memory devices arranged in a column direction in the plurality of memory devices are supplied with, via a common line, a second spike signal that is either the presynaptic spike or the postsynaptic spike being not the first spike signal.

* * * * *